US011680792B2

(12) United States Patent
Wagenleitner et al.

(10) Patent No.: US 11,680,792 B2
(45) Date of Patent: Jun. 20, 2023

(54) INCOMING RUNOUT MEASUREMENT METHOD

(71) Applicant: EV Group E. Thallner GmbH, St. Florian am Inn (AT)

(72) Inventors: Thomas Wagenleitner, Aurolzmunster (AT); Frank Bogelsack, Eitzing (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/959,230

(22) PCT Filed: Feb. 27, 2018

(86) PCT No.: PCT/EP2018/054840
§ 371 (c)(1),
(2) Date: Jun. 30, 2020

(87) PCT Pub. No.: WO2019/166078
PCT Pub. Date: Sep. 6, 2019

(65) Prior Publication Data
US 2020/0333136 A1 Oct. 22, 2020

(51) Int. Cl.
*G01B 11/27* (2006.01)
*G01B 11/00* (2006.01)

(52) U.S. Cl.
CPC .......... *G01B 11/272* (2013.01); *G01B 11/002* (2013.01)

(58) Field of Classification Search
CPC .............................. G01B 11/272; G01B 11/002
USPC ......................................................... 356/139
See application file for complete search history.

(56) References Cited

U.S. PATENT DOCUMENTS

| 5,017,514 A | * | 5/1991 | Nishimoto | ................ G03F 9/00 430/311 |
| 5,256,578 A | | 10/1993 | Corley et al. | |
| 5,715,063 A | * | 2/1998 | Ota | .......................... G03F 9/70 356/399 |
| 5,716,889 A | * | 2/1998 | Tsuji | ..................... H01L 23/544 257/E23.179 |

(Continued)

FOREIGN PATENT DOCUMENTS

| CN | 102692831 A | 9/2012 |
| CN | 103582848 A | 2/2014 |

(Continued)

OTHER PUBLICATIONS

International Search Report from corresponding International Patent Application No. PCT/EP2018/054840, dated Aug. 9, 2018.

(Continued)

*Primary Examiner* — Tarifur R Chowdhury
*Assistant Examiner* — Omar H Nixon
(74) *Attorney, Agent, or Firm* — Kusner & Jaffe

(57) ABSTRACT

A mark field, having at least two location marks with information for the location of the respective location mark in the mark field, and at least one position mark, which is or can be assigned to one of the location marks. Furthermore, the invention relates to a device for determining X-Y positions of structural features of structures arranged on a substrate, wherein the X-Y positions relative to the mark field, which is fixed with respect to the substrate, can be determined. Furthermore, the invention relates to a corresponding method.

17 Claims, 17 Drawing Sheets

(56) References Cited

U.S. PATENT DOCUMENTS

| | | | |
|---|---|---|---|
| 8,785,930 B2* | 7/2014 | Brambilla | H01L 23/544 |
| | | | 257/E21.531 |
| 9,395,635 B2 | 7/2016 | De Boer et al. | |
| 9,899,332 B2* | 2/2018 | Butler | H01L 23/544 |
| 2002/0063856 A1* | 5/2002 | Inoue | G03B 27/42 |
| | | | 355/53 |
| 2003/0235330 A1* | 12/2003 | Tanaka | G03F 9/7084 |
| | | | 382/151 |
| 2005/0213458 A1* | 9/2005 | Iwase | H01L 23/544 |
| | | | 257/E23.179 |
| 2005/0275068 A1* | 12/2005 | Brambilla | H01L 23/544 |
| | | | 257/E23.179 |
| 2006/0278722 A1* | 12/2006 | Tominaga | H01L 23/544 |
| | | | 257/E23.179 |
| 2007/0228171 A1* | 10/2007 | Thiyagarajah | G06K 7/1417 |
| | | | 235/462.09 |
| 2008/0112609 A1* | 5/2008 | Inoue | G03F 9/7046 |
| | | | 382/151 |
| 2009/0315193 A1 | 12/2009 | Ortner | |
| 2011/0228242 A1* | 9/2011 | Wahlsten | G03F 9/00 |
| | | | 355/52 |
| 2012/0019795 A1* | 1/2012 | Postma | G03F 9/7088 |
| | | | 355/77 |
| 2012/0267802 A1 | 10/2012 | De Boer et al. | |
| 2014/0253895 A1* | 9/2014 | Wu | G03F 7/70741 |
| | | | 355/71 |
| 2019/0086824 A1 | 3/2019 | Mathijssen et al. | |

FOREIGN PATENT DOCUMENTS

| | | | | |
|---|---|---|---|---|
| EP | 1832933 | A1 | 9/2007 | |
| EP | 1 921 506 | A2 | 5/2008 | |
| EP | 1921506 | A2 * | 5/2008 | ......... G03F 7/70391 |
| EP | 1921506 | A2 | 5/2008 | |
| JP | H01-269002 | A | 10/1989 | |
| JP | 2001-338782 | A | 12/2001 | |
| JP | 2004-214382 | A | 7/2004 | |
| JP | 2008-124142 | A | 5/2008 | |
| JP | 2011-112570 | A | 6/2011 | |
| JP | 2011-170144 | A | 9/2011 | |
| JP | 2011-170144 | A | 9/2011 | |
| JP | 2012-028778 | A | 2/2012 | |
| JP | 2017-511499 | A | 4/2017 | |
| WO | WO 2014/202106 | A1 | 12/2014 | |
| WO | WO 2015/113641 | A1 | 8/2015 | |

OTHER PUBLICATIONS

Office Action issued in corresponding Chinese Patent Application No. 201880089074.3 dated Nov. 9, 2021 along with English-language translation.

Search Report issued in corresponding Chinese Patent Application No. 201880089074.3 dated Nov. 2, 2021 along with English-language translation.

Office Action issued in related Japanese Patent Application No. 2020-542445 dated Dec. 16, 2021 with English-language translation.

Written Opinion issued in corresponding Singapore Patent Application No. 11201910620T dated Dec. 8, 2021.

Office Action issued in related Japanese Patent Application No. 2020-542445 dated Jul. 26, 2022.

* cited by examiner

Fig. 6
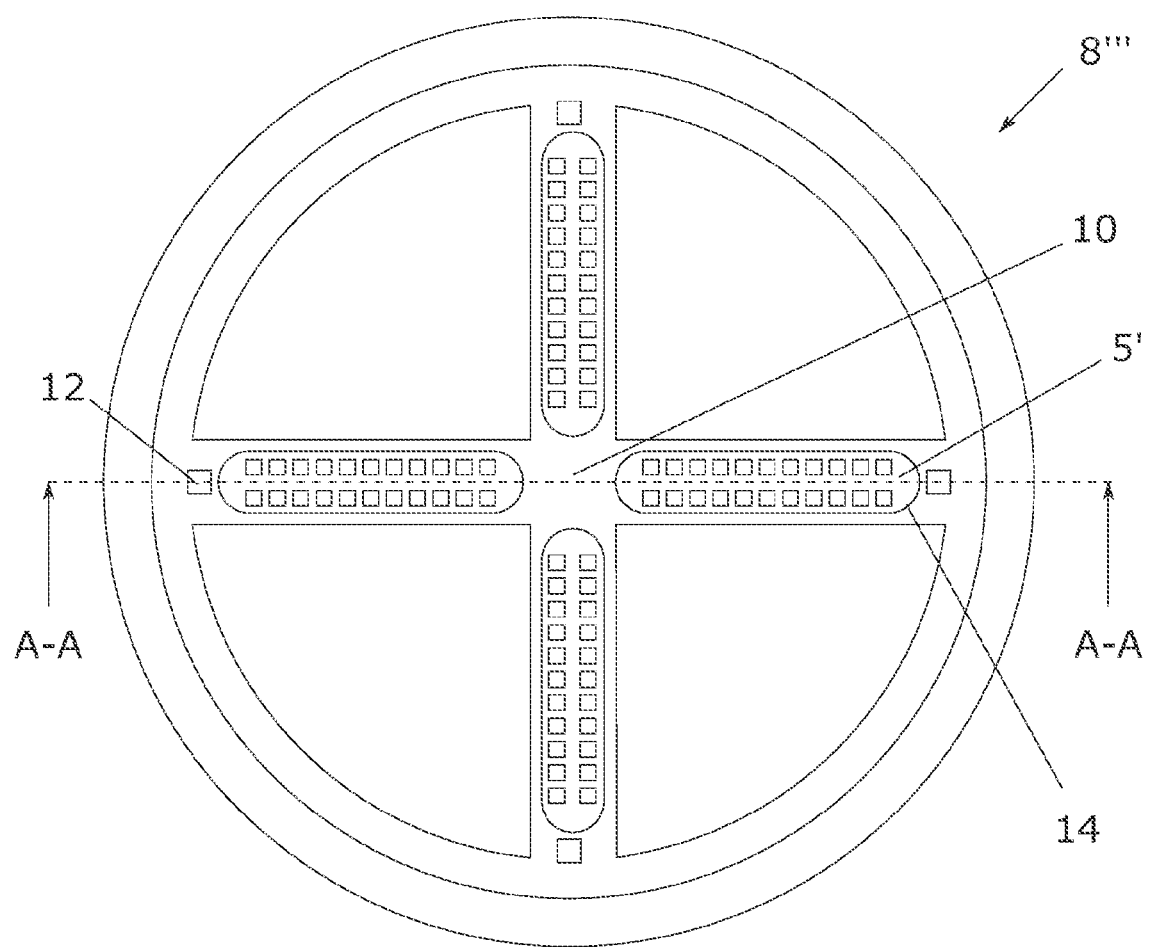
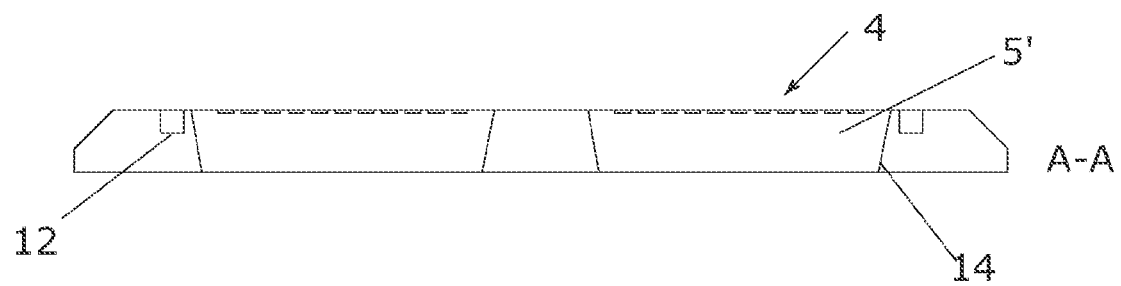

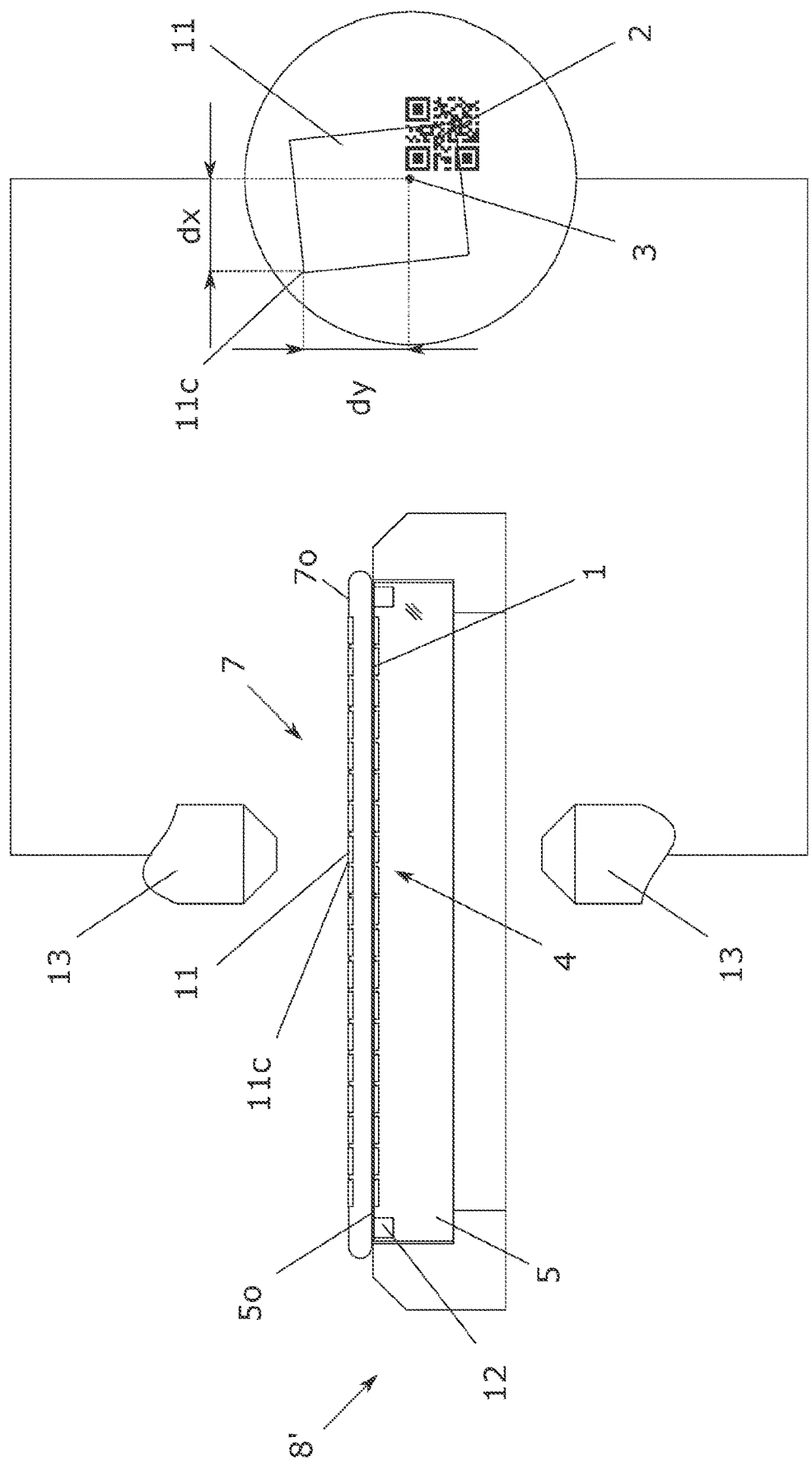

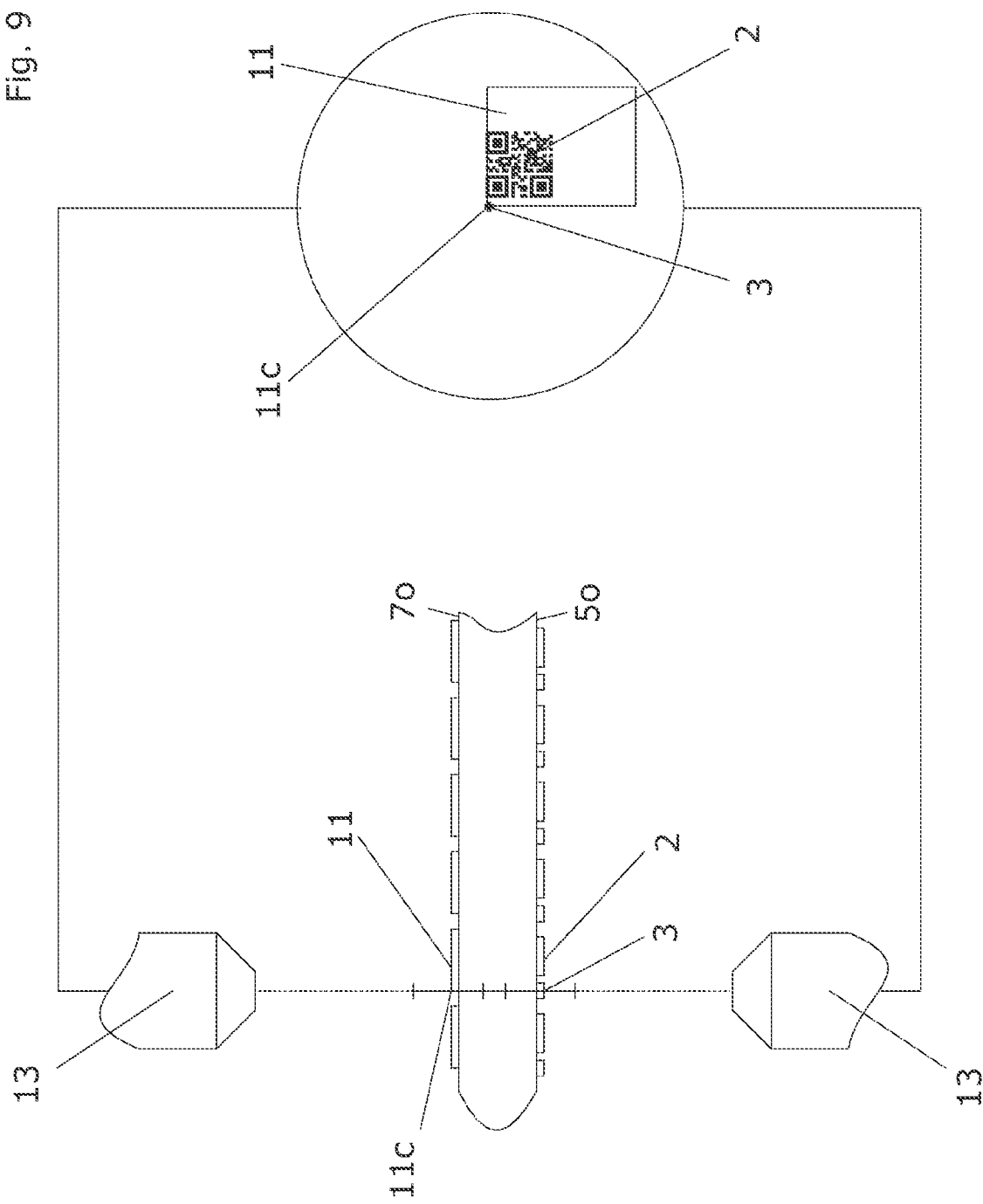

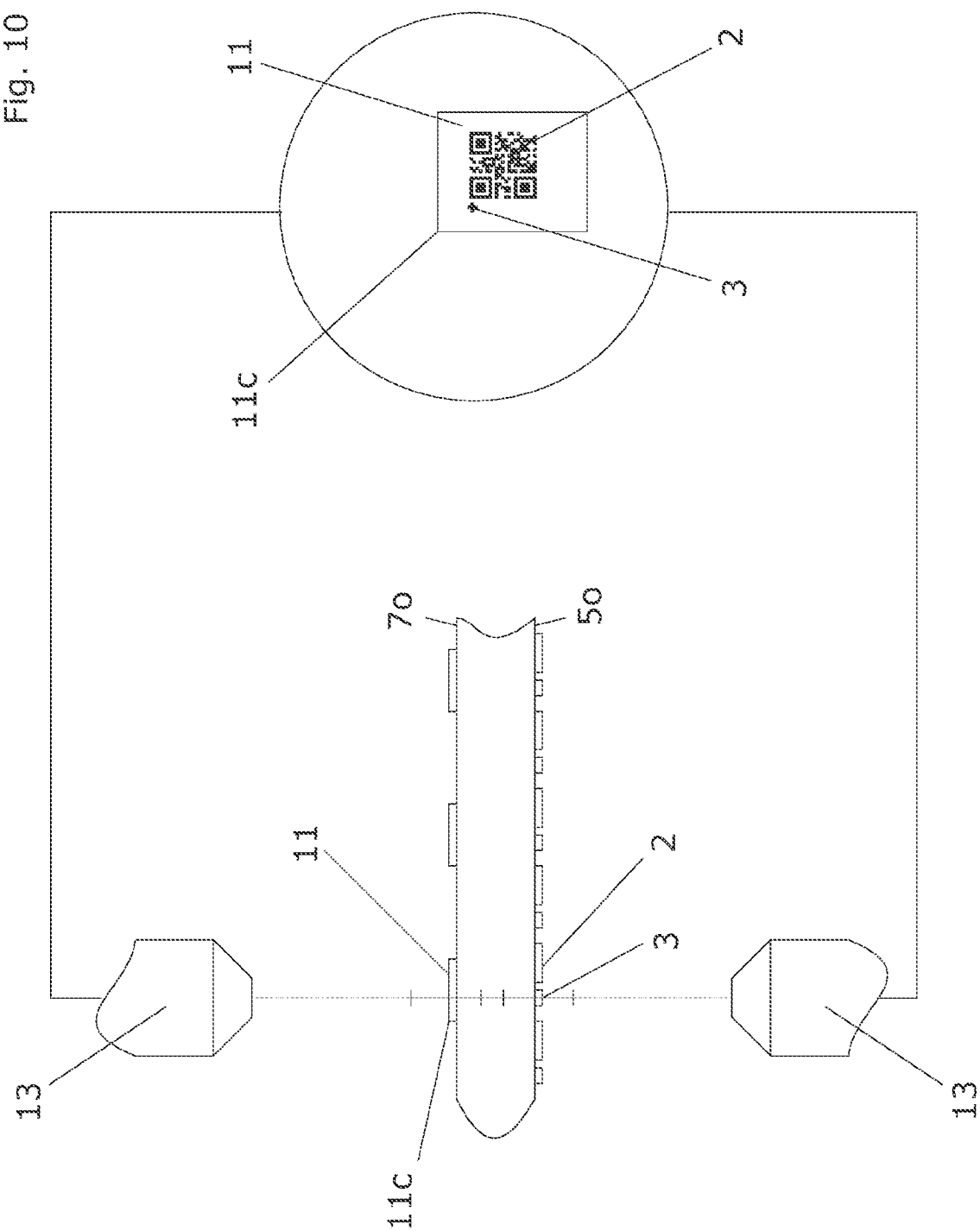

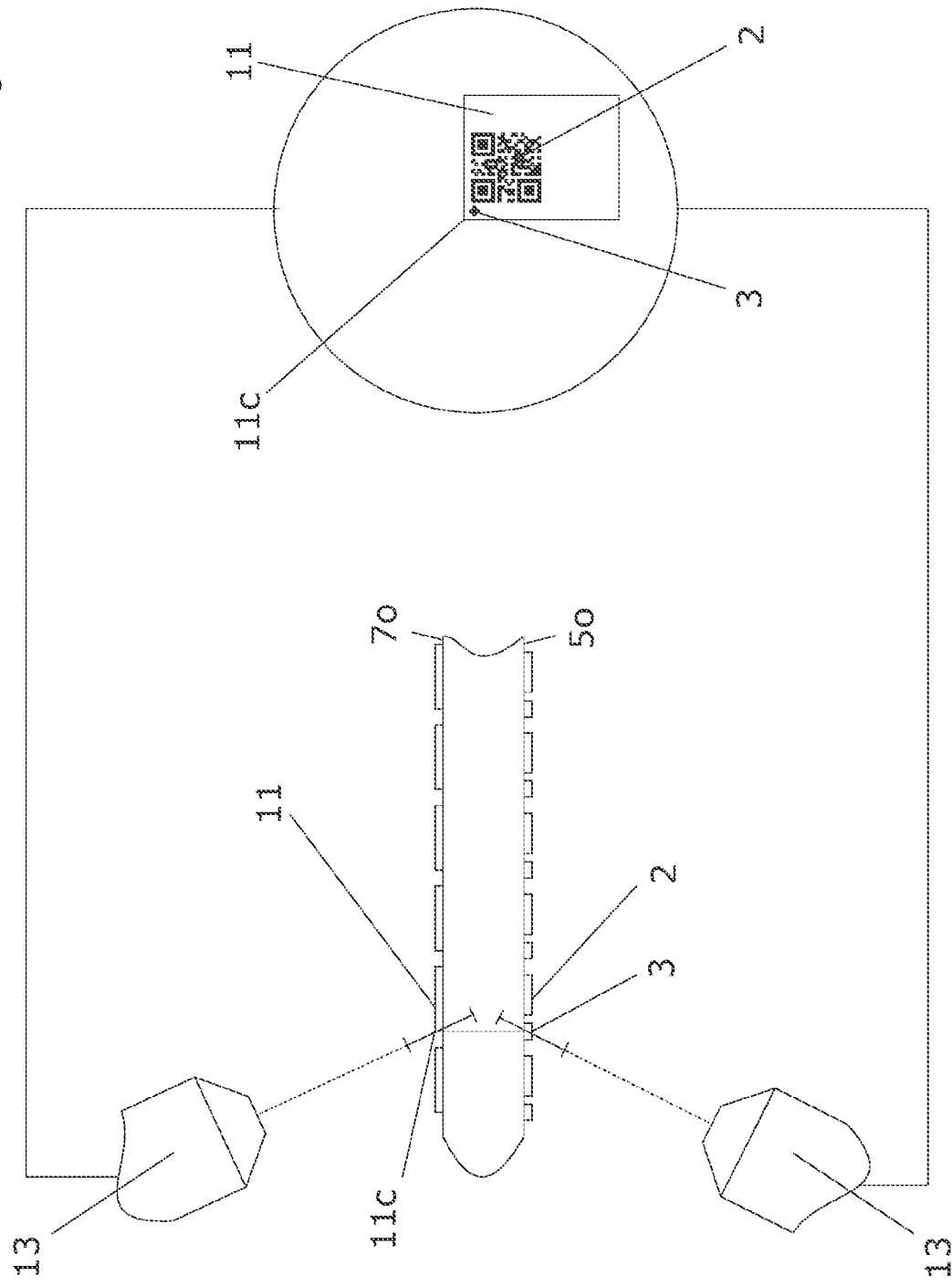

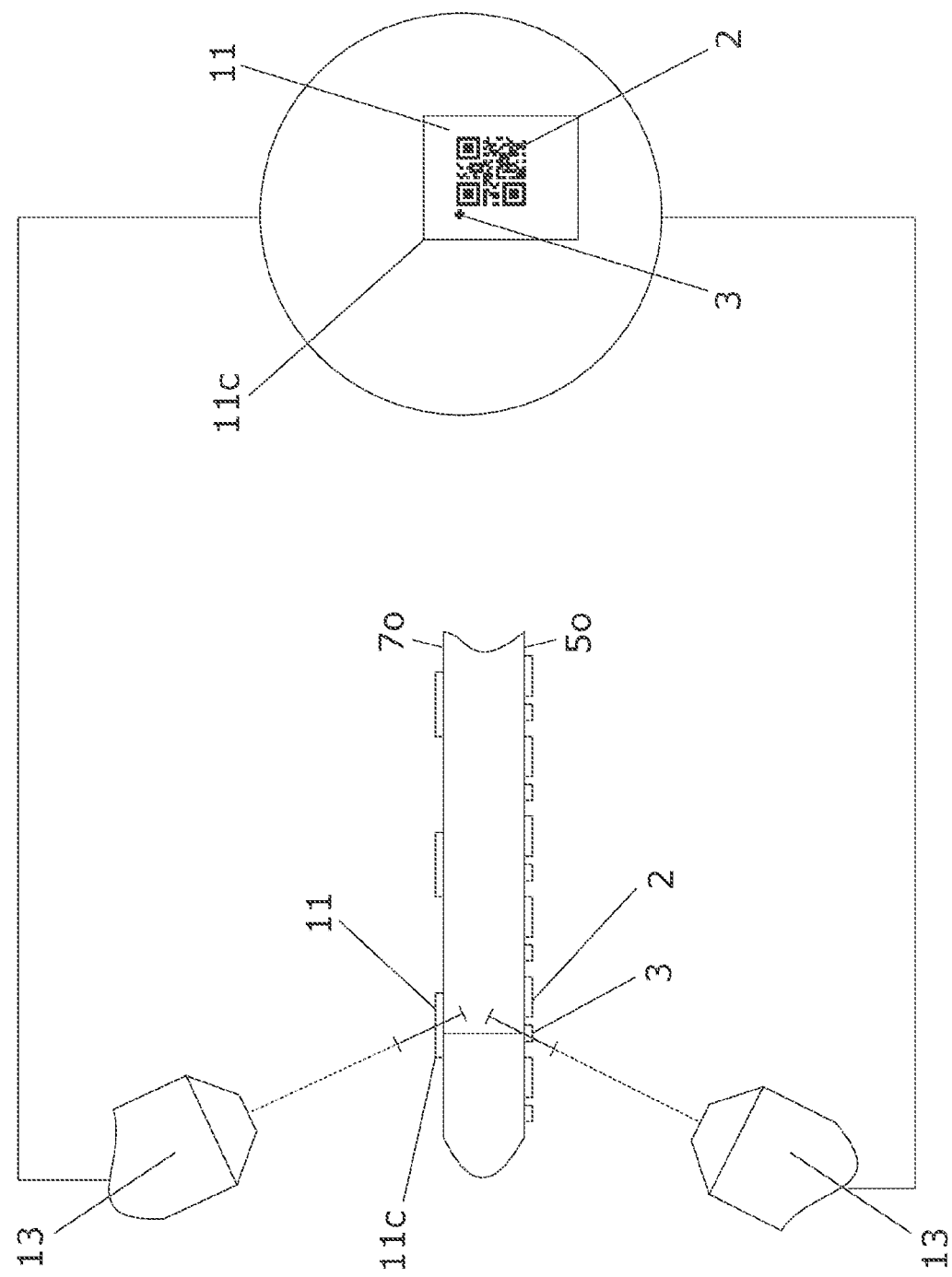

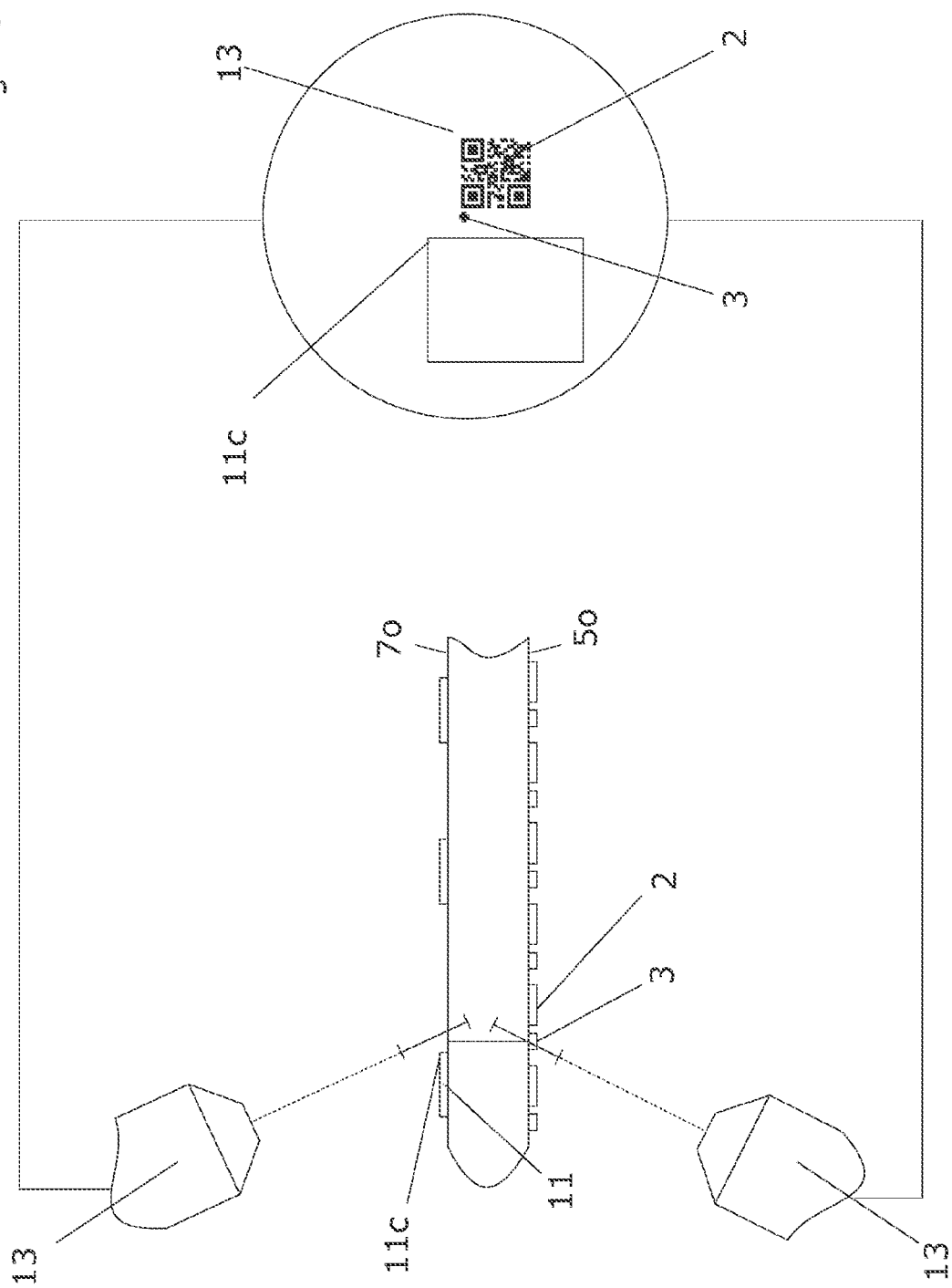

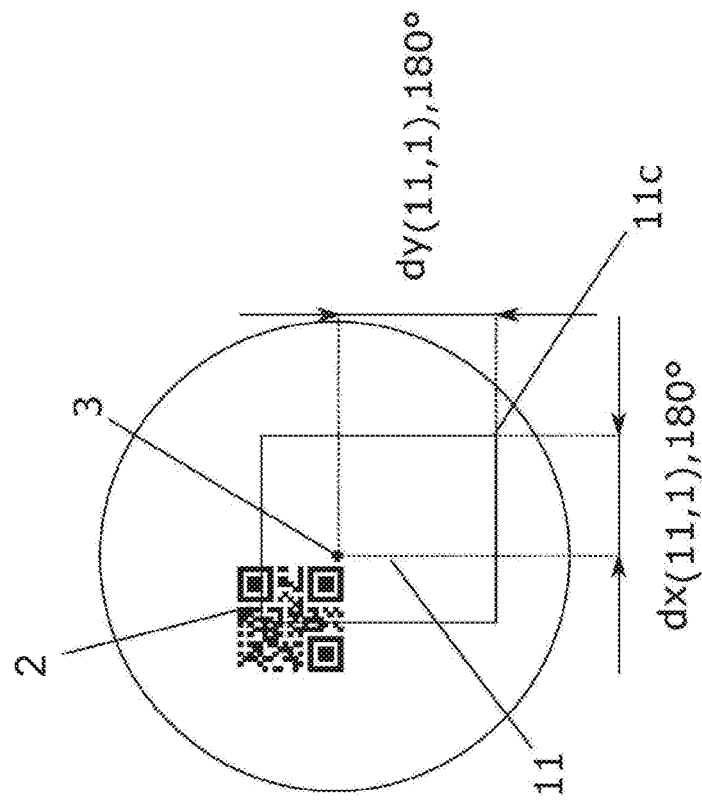
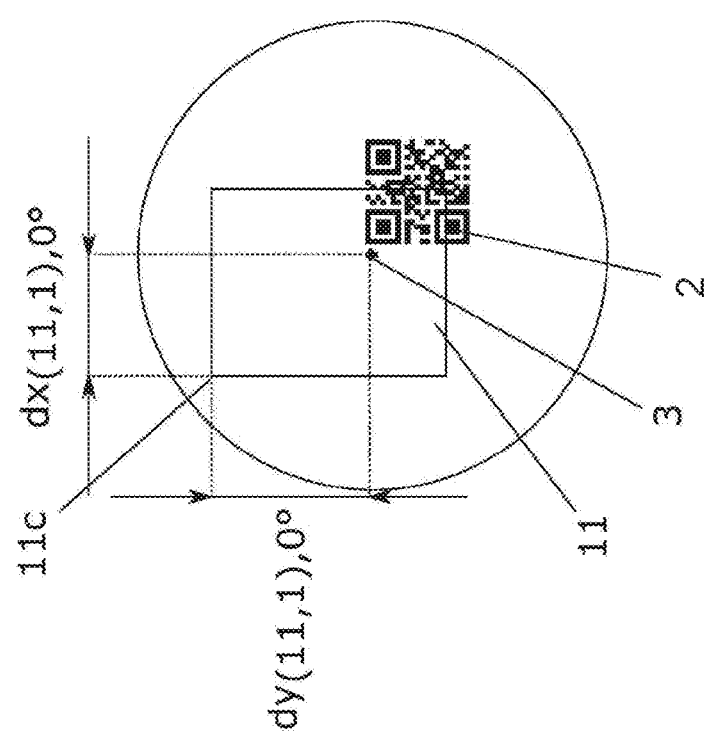

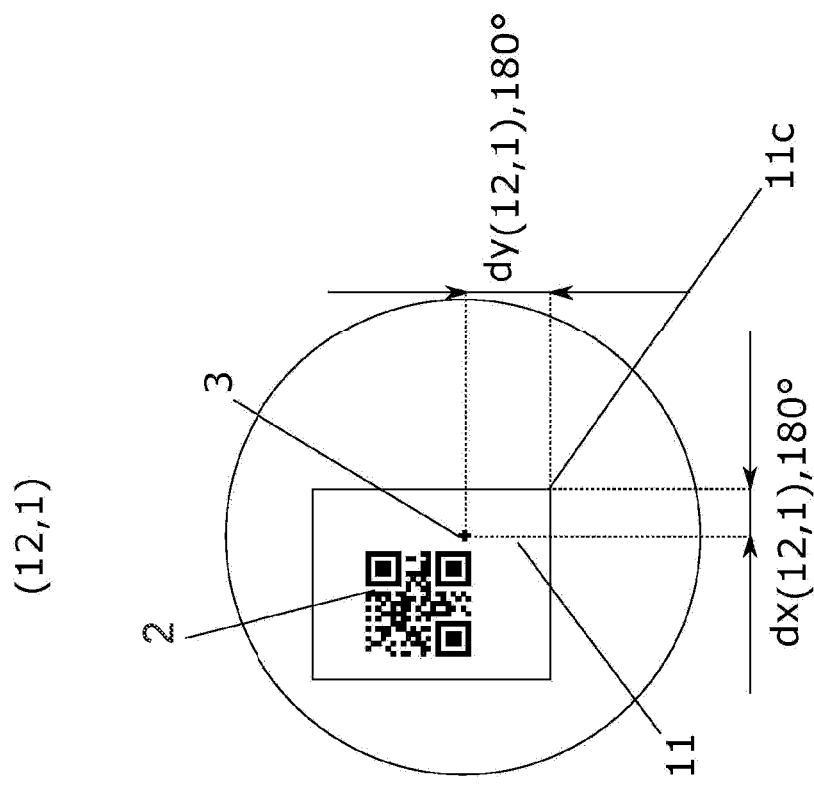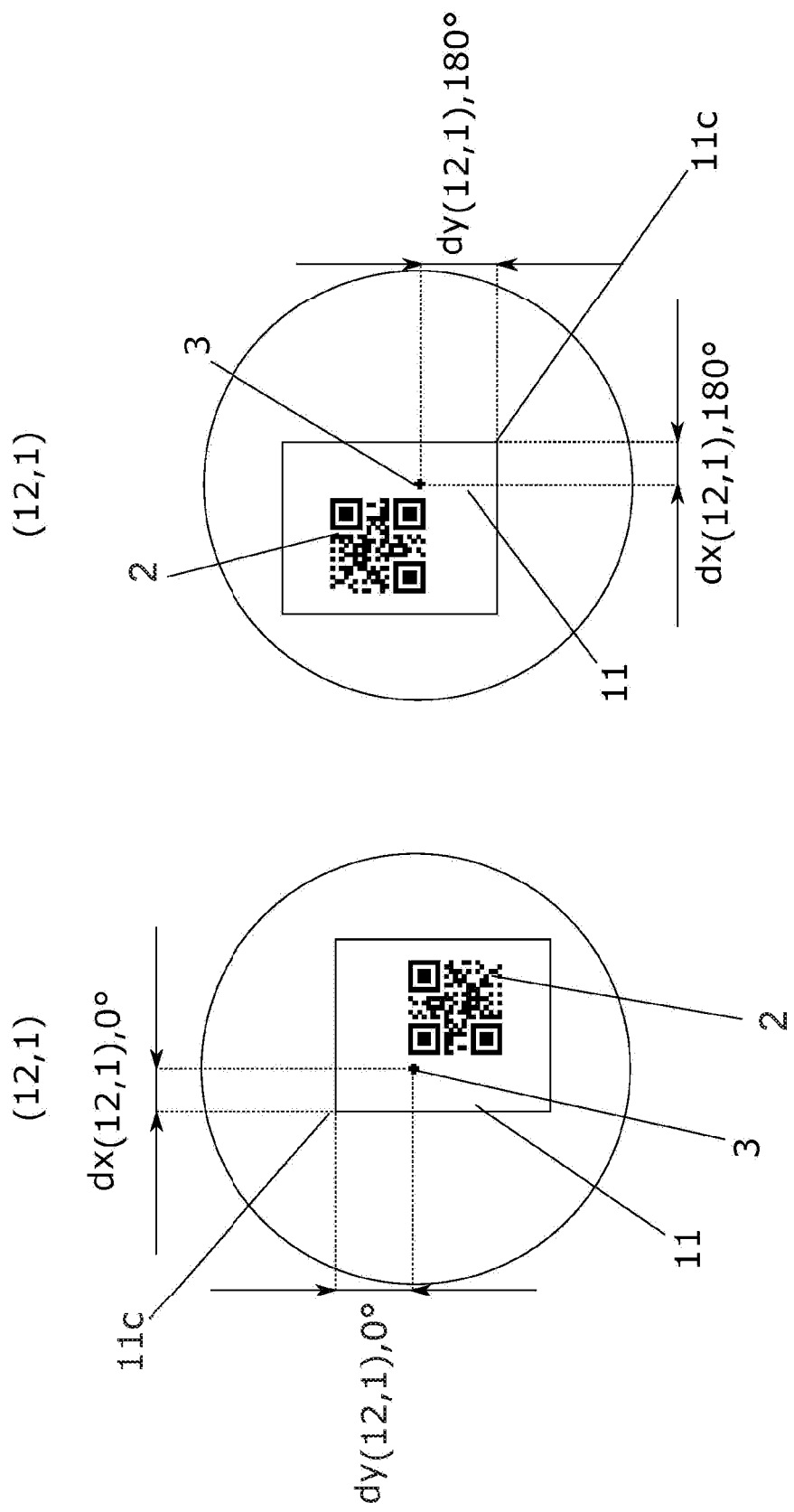

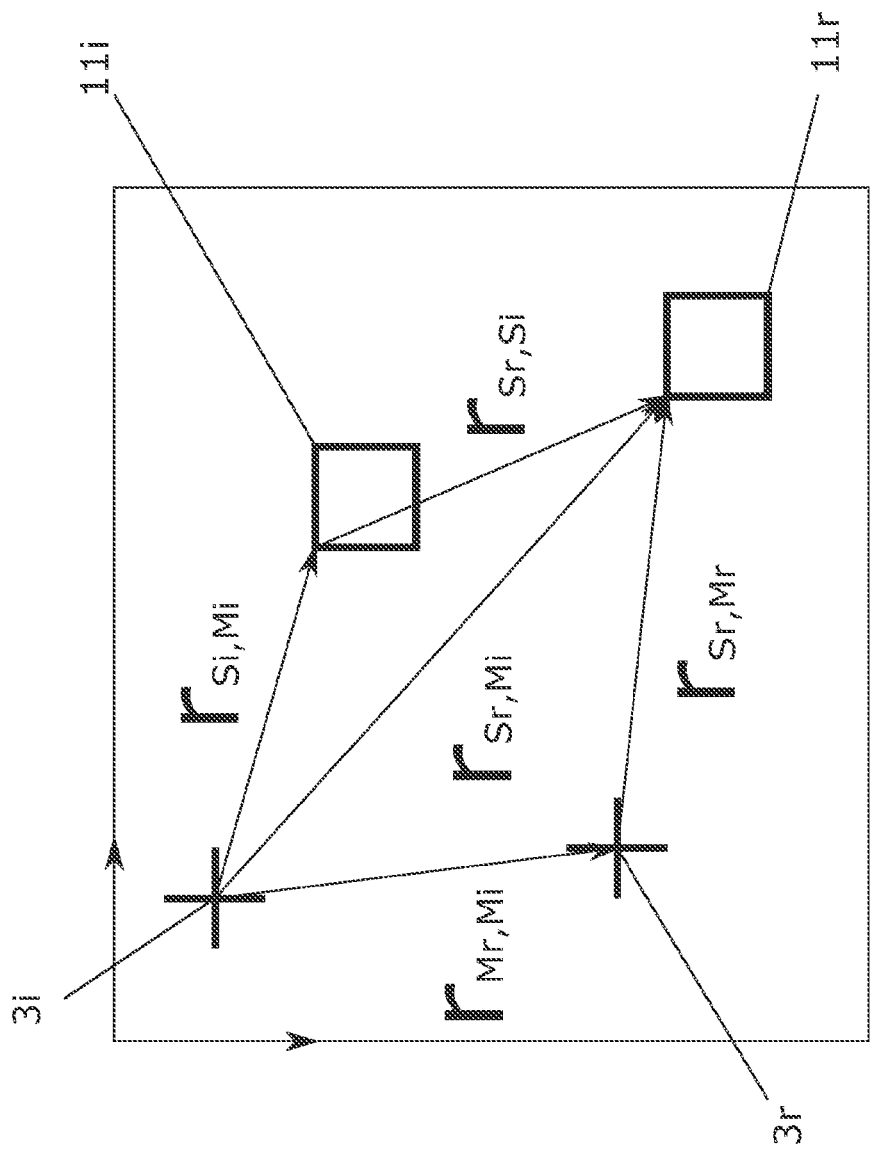

INCOMING RUNOUT MEASUREMENT METHOD

FIELD OF THE INVENTION

The present invention relates to a mark field, a device for determining X-Y positions of structural features of structures arranged on a substrate, and a corresponding method.

BACKGROUND OF THE INVENTION

In industry, it is of decisive importance to obtain a statement about the position of structures on a substrate. The difference between the real actual position and the ideal desired position of a structure is of particular interest. In order to determine the actual positions of structures, one can introduce a coordinate system and specify the position of the structures in relation to this coordinate system. For the most part, this is a body-fixed coordinate system, i.e. a coordinate system assigned to the substrate. The coordinate system is termed a substrate coordinate system in the remainder of the document.

However, in order to be able to measure all structures, a relative movement must take place between the substrate and the measurement system, particularly an optical system with a camera. That is necessary, as not all structures are located in the viewing area of the measurement system. Were all of the structures to be measured located in the viewing area of the measurement system, a relative movement between the measurement system and the substrate would of course not be necessary.

The relative movement takes place for the most part by means of an active movement of the substrate holder, on which the substrate is fixed, so that the filigrane optical system does not have to be moved. In this case, the position of the substrate holder must be determined very accurately, in order to be able to determine the distances which the substrate holder has covered. The position of the substrate holder must therefore be specified in relation to a spatially fixed coordinate system.

It would also be conceivable to only determine the path of the substrate holder covered between two points. In this case, although a spatially fixed coordinate system is dispensed with, a very precise control system is nonetheless required in order to be able to determine the distances covered very accurately.

Each method from the prior art mentioned requires relatively expensive and complicated electronic-mechanical systems, in order to be able to measure the position or the path covered of the substrate holder and therefore the structural positions on the substrate surface of a substrate. Furthermore, the travel paths of such systems are considerable. Due to the corresponding size, even the smallest temperature fluctuations have an influence on the thermal expansions and thus the component sizes of the components used.

In order to be able to measure structures, which are not simultaneously located in the viewing area of an optical system, on the substrate surface of a substrate, a relative movement must take place between the substrate and the optical system, in order to bring the structures into the viewing area of the optical system one after the other. For the most part, the substrate holder, on which the substrate is fixed, travels, whilst the optical systems are fixed. During the travel, the position of the substrate holder must be followed continuously. One therefore requires a reference system in relation to which the position of the substrate holder is specified. The position information of the substrate holder and thus of the substrate must take place very accurately, particularly in the nanometre range. This exact position information, particularly over travel distances of a plurality of centimetres, requires very accurate and therefore expensive measurement systems, particularly interferometers.

SUMMARY OF THE INVENTION

It is an object of the present invention to specify a device and a method for measuring substrates, using which a more accurate and/or more efficient determination of the positions of structures or structural features on substrates is enabled.

This object is achieved with the features of the independent claim(s). Advantageous developments of the invention are specified in the dependent claims. All combinations made up of at least two features specified in the description, the claims and/or the figures also fall within the scope of the invention. When value ranges are specified, values lying within the limits mentioned should also be disclosed as limit values and be claimable in any desired combination.

The invention is based on the idea of providing a mark field having
- at least two location marks with information for the location of the respective location mark in the mark field, and
- at least one position mark, which is or can be assigned to one of the location marks, for determining X-Y positions of structural features of structures on a substrate, particularly independently of a movement or position of a substrate holder.

The measurement according to the invention of the structures of a substrate in further process steps in particular allows a more accurate and more efficient bonding process of two substrates to one another. If the measured structural positions do not correspond to the desired structural positions, a compensation of at least one of the two substrates takes place in particular prior to and/or during the bonding process.

In other words, substrate pairs are preferably formed according to selection criteria.

In particular, according to the invention, a location, particularly rotational location, of the structures is determined from two X-Y positions or from further features of the location marks and/or position mark(s).

Furthermore, it is conceivable according to the invention to determine expansions or distortions of the structures from two X-Y positions or from further features of the location marks and/or position mark(s).

One, in particular independent, inventive aspect lies in associating or setting in relation individual X-Y positions of structural features of structures on the substrate surface of a substrate with position marks on a surface opposite the substrate surface of the substrate, particularly in determining the spacings thereof in the X and/or Y direction. To this end, in addition to the position marks, location marks are additionally used in particular. Due to the use of such position and location marks, it is no longer necessary to determine or to follow the position of the substrate holder highly precisely using technically complicated, in particular optical, measurement systems. A rough determination of the current position takes place in particular by means of the reading and interpretation of location marks. A more precise determination of the current position can in particular take place by means of additional position marks, preferably assigned to the location marks.

The invention therefore describes a method and a device for the determination, particularly measurement, preferably position measurement, of structures or structural features, without having to determine the position of the substrate holder, and therefore the position of the substrate, relatively to a (different) reference system.

A further, in particular independent core of the invention provides a method and a device, with the aid of which in particular, it is possible to dispense completely with the use of a spatially fixed reference system, in relation to which the X-Y position of the substrate holder is specified or measured.

The basic idea in particular includes constructing a mark field, preferably on a surface, which mark field is or can be arranged opposite the substrate surface, on which the structures or structural features should be measured.

The mark field in particular has two properties: Each mark of the mark field is encoded such that a measurement system, particularly an optical system is able to draw a conclusion about the location of the mark. When this location is known, the device can carry out a highly accurate position determination by means of highly accurate position marks, which are preferably assigned to the respective location mark.

If the mark field is known and two optical systems, which are calibrated with respect to one another, are used, the structures/structural features of the substrate surface of the substrate to be measured can therefore be associated with the marks and vice versa. As a result, calculations, particularly of spacing changes, become possible, without a spatially fixed external reference system being necessary.

Reference systems, in relation to which the position of the substrate holder have to be recorded, are no longer required. Thus, one no longer has to follow the position of the substrate holder, neither optically with the aid of interferometers nor mechanically with the aid of step counters. Therefore, it is provided in a development of the invention that, in particular no means for the, in particular continuous, detection of the position of the substrate holder, beyond the means described in the following and disclosed according to the invention are used or installed according to the device.

An important further aspect of the present invention in particular includes reducing or, to the greatest extent possible, preventing distortions of the mark field and/or the position marks.

Mark

According to the invention, a mark is understood in the widest sense to mean an optically detectable and/or topographically detectable structure (or structural features of the structure), which or the position of which, preferably at least the X-Y position of which, can be detected and thus determined with the aid of a measuring instrument. Measuring instruments for detecting the structures/structural features and thus determination of the position thereof may in particular be:

optical systems, in particular cameras
contacting systems, in particular AFM.

A mark preferably comprises at least one of the following listed materials:

metal, in particular
Cr, Al, Ti, Cu, Ag, Au, Fe, Ni, Co, Pt, W, Pb, Ta, Zn, Sn,
alloy, in particular
metal alloy,
metal/non-metal alloy,
ceramic,
plastic,
semiconductors, in particular
compound semiconductors, in particular
GaAs, GaN, InP, InxGa1-xN, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te, BeSe, HgS, AlxGa1-xAs, GaS, GaSe, GaTe, InS, InSe, InTe, CuInSe2, CuInS2, CuInGaS2, SiC, SiGe,
semiconductors, in particular
Ge, Si, alpha-Sn, fullerenes, B, Se, Te.

Preferably, the marks are optically detected, thus optical measurements are described in the following. A mark is comprised in particular of a location mark and a position mark. According to the invention, location marks are preferably encodable or encoded marks, that is to say information carriers. Position marks are used, in particular exclusively, for the determination of a highly accurate position, particularly X-Y position.

In particular, the location mark and a position mark assigned to the location mark can be detected simultaneously in the viewing area of the respectively used optical system. Preferably, the location mark, in particular each location mark, is arranged in the close surroundings of the assigned position mark, so that the simultaneous detection is ensured.

According to an advantageous embodiment of the invention, it is conceivable that the location mark has one or more position marks.

The location marks are in particular smaller than 5 mm×5 mm, preferably smaller than 1 mm×1 mm, more preferably smaller than 0.1 mm×0.1 mm, most preferably smaller than 0.01 mm×0.01 mm, most preferably of all smaller than 0.001 mm×0.001 mm. Particularly preferably, the location marks have a width or a diameter of between 20 μm and 200 μm.

The position marks are in particular smaller than 0.1 mm×0.1 mm, preferably smaller than 0.01 mm×0.01 mm, more preferably smaller than 0.001 mm×0.001 mm, most preferably smaller than 0.0001 mm×0.0001 mm, most preferably of all smaller than 0.00001 mm×0.00001 mm.

The location and/or the position marks are preferably parts of a pattern generated in a computer. The positions of the location and position marks in the digital pattern are to be considered ideal. The real location position marks are created by producing the location and position marks, particularly by means of layer, mask, etching and development technologies. The positions of these real location and position marks will deviate from the desired ideal position, in particular owing to the defective processes and systems. These deviations are preferably minimal and lie in the nanometre range. The accuracy of the location and position marks is therefore all the greater, the less the ideal positions deviate from the real positions. The deviations are in particular smaller than 1 μm, preferably smaller than 500 nm, more preferably smaller than 250 nm, most preferably smaller than 50 nm, most preferably of all smaller than 10 nm.

A further aspect of the invention includes taking account of manufacturing inaccuracies of the mark field carrier, particularly of the marks, primarily of the position marks, which are actually to be produced in a highly accurate manner. Accordingly, the device in particular has a mark field, the position marks of which were not manufactured in a highly precise manner, as a result of which production costs can be reduced considerably.

In order nevertheless to have recourse to a position mark field, which has highly precise positions, a desired position mark field is stored, in particular saved in a computer. The positions of the position marks in the computer are to be considered as ideal, whilst the actual positions of the position mark field produced (actual positions) may deviate therefrom. In an adjustment process, the mark field of the mark field carrier is measured (determination of the actual positions) and the relative positions between the ideal position marks in the computer and the real position marks on the mark field carrier are determined and saved.

From this, a corresponding correction in relation to the ideal position mark is calculated for each real position mark, particularly in the form of a vector with regards to the respective position. Using this method, it is possible to correlate the structures on the substrate with the real position marks on the mark field carrier and to correlate this in turn with the ideal position marks in the computer. Due to this idea, the manufacturing costs of the mark field carrier can be lowered immensely, particularly by means of a less accurate production of the mark field, and this therefore leads to an economic advantage.

According to the invention, each location mark is individualized in a mark field. Due to the individualization, confusion of different location marks is excluded, so that it is possible to extrapolate to an X-Y coordinate region of the location mark on the mark field by means of the detection of each location mark. The coordinate system of the mark field is termed the mark field coordinate system in particular.

In the case of the location mark, this is preferably one or more of the following characteristics:
QR code,
barcode,
geometric, particularly three-dimensional figure,
character sequence, particularly letter sequence and/or number sequence,
preferably a binary code,
image.

The location mark is an information carrier in particular. Preferably, each location mark is encoded with an X-Y position, which indicates the position at which in the matrix, the location mark is located, that is to say in which the X-Y coordinate region the location mark is situated.

The position marks can be constructed as simple or complex structures. The precise shape of the position marks is not covered in any more detail, as these are known per se in the prior art. In the figures, the position marks are illustrated as a cross in particular. Position marks are preferably produced identically and preferably look the same as alignment marks which are very common in the prior art. Thus, the technologies which are used in the prior art for the analysis of alignment marks may also be used for the analysis of the position marks.

In very particularly preferred embodiments according to the invention, the position mark surrounds, particularly encloses, the location mark. In this case, the position mark is in particular realized as a circle, rectangle, octagon or any desired other geometric figure, which can easily be recognized and evaluated by software.

Mark Field

The mark field is comprised in particular of a quantity of marks, which are preferably arranged highly symmetrically to one another, i.e. location and position marks. According to the invention, it is primarily important that the position marks are produced highly precisely with respect to one another. The location mark, which is or can be assigned to a position mark, is arranged in such a manner that both are preferably located in the viewing area of the optical system simultaneously. The location mark is used, particularly exclusively, for reading the approximate location position, only termed location in the remainder of the text, which is observed by the optical system. Preferably, the relative position between each location mark and the assigned position mark is identical. That facilitates the programming of an evaluation algorithm and thus the search for location and/or position marks in the mark field as soon as both are located in the viewing area of the optical system.

In a very particularly preferred embodiment, the location mark is surrounded, in particular enclosed, preferably completely, by the position mark.

Thus, the manufacturing accuracy of the location marks can be lower than that of the position marks, as a result of which the production costs for the mark field are minimized.

Should the mark field be comprised of marks in which the location mark and the position mark have been merged with one another, all marks of the mark field are preferably produced highly precisely, as each mark is location mark and position mark simultaneously, that is to say has both functions.

Preferably, the marks are arranged in an, in particular symmetrical, matrix with uniform spacings between the location marks. The adjacent location marks and/or position marks are preferably arranged equidistantly on the mark field. In particular, more than 10×10 marks, preferably more than 100×100 marks, more preferably more than 1000×1000 marks, most preferably more than 10000×10000 marks, most preferably of all more than 100000×100000 marks, are located in a mark field. Spacings between adjacent location marks are in particular smaller than the width and/or height or the diameter of the location marks. Preferably, the ratio between the spacing and the width and/or height or the diameter of the location marks is smaller than 1, more preferably smaller than 0.5, more preferably smaller than 0.1.

Preferably the location marks encode the X-Y position in the matrix. As a result, it is possible, when detecting the location mark, to draw a conclusion about the respective matrix region which has just been detected by the detection means, particularly one or more optical systems. The encoding of additional information in each location mark, for example the location of the assigned position mark with respect to the location mark, is also conceivable.

For the sake of completeness, it is disclosed that the marks do not have to be located on a highly symmetrical matrix. The distribution of the marks may be arbitrary as long as the spacing relationships (vectors or X-Y spacings) between the position marks are known and the respective location marks can be associated with their corresponding position marks. A distribution of the marks on a non-symmetrical matrix constitutes an impaired embodiment.

The mark field is preferably on the one hand arranged as close as possible to the substrate surface, on which the structures are located, which should be measured or the X-Y positions of which are determined according to the invention. On the other hand, the structures, which form the mark field, should be protected from damage. The spacing between the structures to be measured and the mark field carrier is preferably between 0.1 mm and 100 mm, preferably between 0.25 mm and 75 mm, more preferably between 0.5 mm and 50 mm, most preferably between 1 mm and 30 mm, most preferably of all between 5 mm and 20 mm.

In particular, the mark field is arranged on the side of the mark field carrier facing away from the substrate, in order to protect it from mechanical loading and wear, as it does not come into contact with the substrate directly in this manner. It is also conceivable that the mark field is covered with a transparent coating, in order to protect it from mechanical and/or chemical influences.

Mark Field Carrier

A mark field carrier according to the invention is or are the components on which a mark field is applied.

According to a first embodiment according to the invention, the substrate holder itself is the mark field carrier. The mark field is located on one of the two surfaces of the substrate holder, preferably on the fixing surface on which the substrate is fixed.

If the mark field is located on the fixing surface, at least below the mark field, the substrate holder is preferably constructed at least partially transparently with respect to the electromagnetic radiation, using which the mark field is observed.

If the mark field is located on the surface opposite the fixing surface, the substrate holder may also be non-transparent.

In a second, particularly preferred embodiment according to the invention, the mark field carrier is an independent component, which can be fixed in or on the substrate holder and therefore can be replaced fast.

Preferably, in this case also, the mark field is applied on the fixing surface and the component is at least partially transparent for the electromagnetic radiation used. By means of this design, the mark field carrier can be produced separately from the substrate holder. As a result, the flexibility is increased and a replacement is facilitated. Furthermore, the production costs can be lowered.

According to a development according to the invention, the substrate holder is constructed in such a manner that the mark field carrier can be inserted into the same and is supported peripherally exclusively. In this particular embodiment, the mark field carrier is constructed to be as thick as possible, so that the bending resistance is as large as possible and a distortion of the position marks is minimized, preferably is dispensed with completely. The only peripherally supported mark field carrier is bent all the more strongly by gravitational force, the thinner it is constructed. The bending leads to stretching of the mark field carrier surface, which points in the direction of gravity. Consequently, the mark field would also be buckled, as a result of which the quality of the determination of the X-Y positions falls.

According to a different development according to the invention, the substrate holder is constructed in such a manner that the mark field carrier can be inserted into the substrate holder and supported not only peripherally, but rather also from below by struts, which run together at the centre in particular. The struts primarily minimize bending of the mark field carrier. Preferably, the struts are at least partially transparent for the electromagnetic radiation used during the detection of the X-Y position of the structures. If the struts are non-transparent, no correlation can be produced between the marks of the mark field and the structures on the substrate surface along the surface covered by the struts.

The transmittance of the mark field holder and/or the struts is in particular greater than 10%, preferably greater than 25%, more preferably greater than 50%, most preferably greater than 75%, most preferably of all greater than 95%.

The problem of the bending can primarily be counteracted using a mark field carrier which is as thick as possible. The thickness of the mark field carrier is in particular greater than 1 mm, preferably greater than 2 mm, more preferably greater than 5 mm, most preferably greater than 20 mm, most preferably of all greater than 30 mm. The thicker the mark field carrier is, the greater is the bending resistance thereof and thus the mark field carrier can be deformed to a lesser extent by bending.

The substrates may have any desired shape, but are preferably circular. The diameter of the substrates is in particular industrially standardized. For wafers, the industry-standard diameters are 1 inch, 2 inches, 3 inches, 4 inches, 5 inches, 6 inches, 8 inches, 12 inches and 18 inches. The embodiment according to the invention may however fundamentally handle any substrate, independently of the diameter thereof.

The mark field carrier and/or the mark field have a diameter and/or a circumferential contour, which substantially corresponds to the diameter of the substrate in particular.

In particular embodiments, the diameter of the mark field carrier is greater than that of the substrate, in particular greater than 1.01-times, preferably greater than 1.05-times, more preferably greater than 1.1-times, most preferably greater than 1.2-times, most preferably of all greater than 1.2-times the diameter of the substrate.

According to a development according to the invention, the struts are as transparent as possible. Preferably, the struts themselves are manufactured from a material, which is completely transparent for the electromagnetic radiation used. It is also conceivable to provide the struts, to the greatest extent possible, with grooves and holes, in order to create as many viewing areas as possible for the optical system used. The grooves and holes may be closed with transparent inserts, particularly in a positive-fitting and/or flush manner, in order to increase the reduced supporting action again.

The mark field carrier is preferably at least partially manufactured from at least one of the following materials
  metal, in particular
    Cu, Ag, Au, Al, Fe, Ni, Co, Pt, W, Cr, Pb, Ti, Ta, Zn, Sn and/or
  plastic, in particular
    elastomers, in particular
      Viton (material) and/or
      polyurethanes and/or
      Hypalon (material) and/or
      isoprene rubber (material) and/or
      nitrile rubber (material) and/or
      perfluoro rubber (material) and/or
      polyisobutene (material),
    thermoplastic elastomers and/or
  semiconductor material, in particular
    compound semiconductors
      GaAs, GaN, InP, InxGa1-xN, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te, BeSe, HgS, AlxGa1-xAs, GaS, GaSe, GaTe, InS, InSe, InTe, CuInSe2, CuInS2, CuInGaS2, SiC, SiGe
    semiconductors, in particular
      Ge, Si, alpha-Sn, fullerenes, B, Se, Te
  glass, in particular
    metallic glasses
    non-metallic glasses, in particular
      organic non-metallic glasses
      inorganic non-metallic glasses, in particular
        non-oxide glasses, in particular
          halide glasses
          chalcogenide glasses
        oxide glasses, in particular
          phosphate glasses silicate glasses, in particular
aluminosilicate glasses
lead silicate glasses
alkali silicate glasses, in particular
alkali alkaline earth silicate glasses
borosilicate glasses
borate glasses, in particular
alkali borate glasses
quartz ceramic minerals, in particular sapphire.

The mark field carrier is preferably
cylindrical,
cuboid (preferred).

Fundamentally, the mark field carrier may assume any desired shape, however.

The mark field carriers are preferably manufactured from a material which has a very low coefficient of thermal expansion, so that temperature fluctuations do not lead to distortion of the mark field carrier and thus of the mark field.

If the mark field carrier is comprised of a material which has a coefficient of thermal expansion which is not vanishingly small, then the mark field carrier is preferably installed in such a manner that the mark field surface is hindered from expanding, that is to say cannot expand in spite of any temperature fluctuations or deviations. This state is in particular achieved in terms of construction technology in that the mark field carrier is installed into a component, particularly a substrate holder, which itself is comprised of a material with a low coefficient of thermal expansion.

The coefficient of thermal expansion of the mark field carrier should be as small as possible, in order to prevent a distortion of the mark field carrier or the component, which impairs the expansion of the mark field carrier, due to temperature differences. The coefficient of thermal expansion is in particular lower than $10^{-4}K^{-1}$, preferably lower than $5*10^{-5}K^{-1}$, more preferably lower than $10^{-5}K^{-1}$, most preferably lower than $5*10^{-6}K^{-1}$, most preferably lower than $10^{-6}K^{-1}$, most preferably of all lower than $10^{-7}K^{-1}$.

The mark field is preferably arranged as close as possible to the structures of the substrate upon contact of the mark field carrier with the substrate to be measured. Due to the targeted minimization of the distance between the mark field and the structures to be measured, any optical fault, which may occur due to the alignment of optical axes of optical systems which are calibrated with respect to one another, is minimized.

In the embodiments in which mark field carrier and substrate holder constitute different components or assemblies, the fixing elements may be located either on the substrate holder and/or the mark field carrier. If the fixing elements are located on the mark field carrier, a control connection between the substrate holder and the mark field carrier is preferably provided, in order to control the fixing elements of the mark field carrier.

The fixing elements are used for securing the substrates. The fixing elements may be one or more of the following fixing elements:
  mechanical fixing means, in particular clamps
  vacuum fixing means, in particular with vacuum tracks which are individually controllable or connected to one another
  electrical fixing means, in particular electrostatic fixing means
  magnetic fixing means
  adhesive fixing means, in particular Gel Pak fixing means
  fixing means with adhesive, in particular controllable, surfaces.

The fixing means are, in particular electronically, controllable. Vacuum fixing is the preferred fixing type. Vacuum fixing preferably comprises a plurality of vacuum tracks, which emerge at the surface of the sample holder. The vacuum tracks are preferably individually controllable. In an application, which is more realizable from a technical standpoint, a few vacuum tracks are combined to form vacuum path segments, which are individually controllable and thus can be evacuated or flooded independently of one another. The vacuum segments are preferably constructed in an annular manner.

One particular form of fixing takes place with the aid of a low contact substrate holder (low contact chuck), which is comprised of a plurality of individual, in particular symmetrically distributed elevations (pins). The substrate holder is also termed a studded sample holder (pin chuck). The space between the elevations can be evacuated and in this case functions as a vacuum fixing at the same time. It is advantageous that the substrate is only contacted by the elevations and thus a lower loading and contamination of the substrate side, which is fixed, takes place. A further advantage includes in a low contact substrate holder distorting the fixed substrate as little as possible, which is an advantage for a measurement of the structures of the substrate. A further advantage includes in a low contact substrate holder allowing a much more even fixing of the substrate. Embodiments of such a substrate holder are disclosed in WO2015113641A1, to which reference is made in this respect. Such a low contact substrate holder is preferably at least overwhelmingly non-transparent, so that the mark field according to the invention is located on the surface facing away from the substrate fixing surface.

In a further, less preferred embodiment according to the invention, the substrate on which the structures to be measured are located is the mark field carrier itself. The mark field is arranged on the substrate surface, which is opposite the substrate surface with the structures to be measured. This non-preferred embodiment has the following disadvantages: First, a mark field must be created for each substrate, which entails additional outlay and costs. Second, the creation of structures one side and marks on the other side of the substrate leads to production problems and eventually to distortions. Third, the substrates generally have low bending resistances, which can likewise lead to distortion of the mark field.

According to a development of the present invention, it is therefore advantageous to strictly separate the mark field from the substrate to be investigated, that is to say not arrange the mark field on the substrate itself.

Device

The device according to the invention is comprised of a mark field carrier, a substrate holder and at least two optical systems. The mark field carrier is preferably part of a substrate holder or vice versa. Insofar as the substrate holder or mark field carrier are spoken of in the present description, these are considered as a unit or used synonymously.

The two optical systems are constructed and arranged in such a manner that they are aligned towards one another. The optical axes of the two optical systems are preferably calibrated as well as possible with respect to one another, preferably aligned parallel or flush. Reference is made to the disclosure of the published document WO2014202106A1 with respect to the calibration of two mutually aligned optical systems. The optical systems may be moved translationally in the x and/or y and/or z direction and/or rotated preferably about three spatial axes arranged perpendicularly to one another in each case. The degrees of freedom are used for the calibration of the optical systems. If the two optical systems have been calibrated with respect to one another, preferably relative movement no longer takes place between the optical systems. The optical systems are fixed relatively to one another during the determination according to the invention of the X-Y positions.

For the sake of completeness, the option of coupled movement of two optical systems, which are calibrated with respect to one another, is disclosed. Preferably, the optical systems are mechanically coupled to one another by means of a type of U-shaped connection, so that the optical systems are also fixed relatively to one another here during the determination according to the invention of the X-Y positions. However, more preferred is the mechanical separation of the two optical systems from one another. Preferably, the optical systems are mechanically decoupled as well as possible from the frame or the surface, on which the substrate holder is moved, or at least damped, in order to minimize vibrations.

The frame is preferably mechanically separated from the optical systems or at least damped, in order to prevent a vibration transfer as completely as possible.

Method

Prior to the decisive method steps according to the invention of determining the X-Y positions, the two optical systems are calibrated with respect to one another as well as possible in particular.

In an optimum calibration method, the optical axes of the two optical systems are arranged congruently with respect to one another.

This state is to be achieved with technical difficulty or not to be achieved at all. Preferably, however, attempts should be made to get as close as possible to this state.

A further important step for an optimum calibration of the two optical systems with respect to one another includes overlaying the depths of field of the two optical systems in such a manner that the intersecting region of the depths of field captures the mark field and the structures to be measured simultaneously. That is only possible if the two depths of field are at least as large as or larger than the spacing between the mark field and the structures to be measured, which is hereby disclosed as an advantageous embodiment of the invention. Particularly in the case of thick substrates or in the case of mark field carriers, in which the mark field is located far away from the structures to be measured, the mark field is focused by the one optical system and the structures are focused by the other optical system, i.e. brought into the respective depth of field of the respective optical system.

Prior to the actual method according to the invention, a calibration of the two optical systems with respect to one another is undertaken, in order to be able to take account of any errors, which may come to pass due to an oblique position of the two axes, during the determination of the X-Y positions.

According to the invention, the production of a mark field carrier with a mark field, which can be inserted in as many layers as possible and which can be used for all types of structures of any desired substrates to the greatest extent possible, is preferred. That is in particular also desirable with regards to the high production costs for such a mark field carrier. A mark field constructed as independently as possible from the structures of the structure to be detected is therefore preferred.

In a particular embodiment according to the invention, a plurality of position marks can be assigned to a location mark, so that one obtains a very dense field of position marks. Alternatively or additionally, a plurality of position marks are arranged in the viewing area of the optical system in particular. The viewing area is preferably rectangular, most preferably square, i.e. the number of pixels per viewing-area dimension is constant. The number of position marks per viewing-area dimension in this case at least 1, preferably greater than 3, more preferably greater than 5, most preferably greater than 7, most preferably of all greater than 10. Due to a high number of position marks according to the invention, it is ensured that at least one (preferably at least two) position mark(s) is (are) always to be found in the viewing area, even if the next location mark is not yet visible. The density of the position marks can therefore in particular be greater than the density of the location marks. The density of the position marks is equal, preferably 2-times, more preferably 5-times, most preferably 10-times, most preferably of all 100-times as large as the density of the location marks.

In particular, methods and embodiments according to the invention, in which a plurality of position marks are located in the viewing area simultaneously, allow averaging of the position marks, in which production errors of the position marks are preferably compensated. Due to the averaging, one obtains correspondingly averaged, imaginary position marks, which can then be used as position marks for the measurement of the structures on the substrate surface. Supposing there are four position marks in the viewing area simultaneously, which are all located at the corners of a square. By determining the positions of the position marks, the centre of the square can be determined, which is used as a new position mark. Although this new position mark does not exist physically, it can be determined by a computer and stored and if necessary also drawn in a digital image. For the method according to the invention, it is then irrelevant whether a position mark which is present physically or calculated is used for the method according to the invention.

The method according to the invention can in particular be used, in order to determine the deviation between an actual parameter and a desired parameter of a structure or at least one structural feature of a structure on a substrate surface (that is to say production errors in particular). Conceivable production errors would be that photolithographic processes carry out a slightly oblique light exposure, etching processes distort the edges, etc. In addition, the deviations may be subsequent distortions, in particular due to temperature fluctuations. In particular, the structures may have a rotational error and/or
translational error and/or
scaling error and/or
residual error.

Rotational error is understood to mean an error, in which the structures have experienced a global and/or local rotation in relation to their ideal desired positions. Translational error is understood to mean an error, in which the structures have experienced a global and/or local translation in relation to their ideal desired positions. Scaling error is understood to mean an error, in which the structures have experienced a global and/or local scaling in relation to their ideal desired positions. This error is also termed "run-out" in the professional world. It is characterized in particular in that the error becomes greater with increasing radius. For the most part, this error is a result of a thermal expansion, which has a stronger effect at the edge of a substrate than in the region close to the centre. All other types of errors, which lead to a deviation of the actual structure from the desired structure, are termed residual errors. The effect that the actual structures differ slightly from the desired structures is termed an inherent error or "incoming error" in the following.

Other or additional errors may occur during a subsequent process, in particular a bonding process. The embodiment according to the invention is primarily suitable for measuring structures, before a further process, particularly a bonding process, takes place. The measurement of the actual state of the structures, in particular shortly before a bonding process, is of fundamental importance, in order to guarantee and ensure the congruence of structures of two substrates to be bonded. For the sake of completeness, it is mentioned however, that one can also carry out a measurement of structures in relation to the mark field according to the invention using the method according to the invention, after a bonding process has taken place. To this end, the substrate, through which one investigates the structures, would have to be transparent for the electromagnetic radiation which is respectively used, in order to be able to recognize the structures in the bonding boundary surface. The use of glass substrates would be conceivable. It would also be conceivable that the corresponding substrate is transparent for infrared and one uses infrared radiation for measuring the structures. It would also be conceivable that the substrate is realized to be so thin the is it sufficiently transparent for visible light. For silicon, that would be the case for thicknesses of less than 10 µm, preferably less than 5 µm, more preferably less than 3 µm, most preferably less than 2 µm, most preferably of all less than 1 µm.

Therefore, a method for determining the X-Y positions of the structures/structural features of two substrates to be connected in a subsequent bonding step according to the invention is disclosed as an independent invention.

In an optional method step, the optical axes of the two optical systems used are calibrated in relation to one another. The calibration of the two optical systems preferably takes place using a calibration substrate.

The calibration substrate has a thickness, which approximately corresponds to the spacing between the structures to be measured on the substrate and the mark field. The calibration substrate has two calibration marks, one on each side. These two calibration marks must be correlated with respect to one another as well as possible, i.e. lie directly over one another. In other words, the lateral displacement between the two calibration marks should be minimal. In a particularly preferred embodiment according to the invention, one creates calibration marks of this type in that one creates a passage, in particular a continuous hole, more preferably a continuous etching, from one substrate surface to the other substrate surface. The holes on the substrate surfaces are then congruent to one another over the thickness. This method is termed a hole method in the remainder of the document.

In a first calibration method according to the invention, the upper optical system focusses the upper calibration mark and the lower optical system focusses the lower calibration mark. As the optical axes of the two optical systems are generally not congruent to one another, the two calibration marks, unified in an image, are also not congruent. The spacings in dx1 and dy1 in the x and y direction between the calibration marks are measured and saved.

A 180° rotation of the substrate and a renewed measurement of the calibration marks takes place subsequently. The spacings in dx2 and dy2 in the x and y direction between the calibration marks are measured and saved.

In a further calibration step, the error value dx and dy is calculated.

$$dx=dx1+dx2$$

$$dy=dy1+dy2$$

The thus-determined values dx and dy are then the (doubled) sum errors, comprised of the (doubled) lateral displacement of the calibration marks and the (doubled) optical errors.

dx=(doubled) lateral displacement x+(doubled) optical error x dy=(doubled) lateral displacement y+(doubled) optical error y Due to the aforementioned use of optimum production methods for the calibration marks, in particular the hole method, the lateral displacement can be reduced practically to zero and the values dx and dy represent the (doubled) optical errors.

$$\text{(doubled) optical error } x=dx$$

$$\text{(doubled) optical error } y=dy$$

In the event that the lateral displacements are not vanishingly small, these must be determined using different methods and then subtracted.

$$\text{(doubled) optical error } x=dx-\text{measured(doubled) lateral displacement } x$$

$$\text{(doubled) optical error } y=dy-\text{measured(doubled) lateral displacement } y$$

The optical error in the x and y direction finally results by means of $$\text{optical error } x=\text{(doubled) optical error } x/2$$

$$\text{optical error } y=\text{(doubled) optical error } y/2$$

The optical errors in the x and y direction only have to be calculated once as long as the optical systems no longer have to be moved with respect to one another thereafter. Subsequently, the optical fault in the x and y direction can be called upon in order to correct every measured spacing in the x and y direction between the structure on the substrate surface and the corresponding position mark in the mark field around the optical error. The optical error is preferably saved as a vector and labelled with the letter F in the remainder of the text.

In a further method step according to the invention, a substrate is fixed on the substrate holder and the mark field carrier is fixed to the mark field. Preferably, the substrate and mark field carrier are two separate components. In particular, the substrate is fixed directly on the mark field carrier, which is in turn fixed on the substrate holder.

In a subsequent method step according to the invention, structures, in particular all structures, are travelled onto the substrate surface and measured. Whilst the first, in particular upper optical system has a structure of the substrate in the viewing area, the second, in particular lower optical system, accommodates the corresponding area with at least one location mark and at least one position mark of the mark field. The two images generated can be digitally laid over one another and thus result in an overlay image, which can be evaluated, preferably digitally by means of software.

As soon as a location mark is located in the viewing area of the lower optical system, the information for the X-Y coordinate region of the location mark is evaluated. Thus, it is then known to the device at which rough position the substrate holder and therefore the substrate is located opposite the optical systems. Preferably, the position mark is centred with respect to the lower optical system so that it is located in the centre of the viewing area. Alternatively, the optical system can be centred with respect to a characteristic structural feature of the structure, which should be measured. As a plurality of characteristic structural features of the structure should be measured in relation to the position mark, in order to also be able to determine the rotational location of the structure, the position mark is preferably centred.

The centring of the position mark is preferred, but not important for the realization of the invention, as during a measurement of the spacings between the position mark and the characteristic structural features of the structure, an absolute positioning is not necessary.

Primarily, it is important that at least one characteristic structural feature of the structure is measured relatively to the position mark. For example, in the case of a rectangular structure, the left upper corner may be chosen. In the case of a rectangular structure, it is preferred to measure all four corners in relation to the position mark. Measuring is understood to mean the evaluation of at least two values, namely a horizontal spacing dx and a vertical spacing dy with respect to the same position mark in each case.

In particular, the images and/or the determined data, in particular location data of the location mark and position data of the position mark and structures or structural features, are saved in a computer.
This method step is carried out for any desired number of, preferably all, structures on the substrate.

In a further method step according to the invention—after the X-Y position data of all detected structural features of the structures are present—the determined X-Y positions are set in a relationship to the respective ideal position (desired position). An ideal structure, preferably the mark field, is suitable as a reference in particular. As a result, deviations of the characteristic structural features, i.e. the difference between the desired and the actual state, can be determined.

The accurate, in particular mathematical, determination of the X-Y positions or deviations takes place in particular whilst taking into account one or more of the following listed points:
 the axes of the mark field are not congruent to the axes of the substrate coordinate system,
 the ideal position marks of the mark field in the computer are not identically arranged to the real position marks of the mark field on the mark field carrier. The deviations can be measured and saved,
 the correlation between the positions of the real position marks of the mark field and the positions of the real structures on the substrate can be determined as described in the present document,
 the correlation between the positions of the ideal position marks of the mark field in the computer and the positions of the ideal structures in the computer can be calculated, as the data are always available and do not have to be measured first,
 the optical error can be calculated from the data by means of the values determined in the calibration process,
 the data from the above list always allow the calculation of the deviation of the real structures on the substrate from the ideal structures in the computer.

In one process step, the axial orientation of the mark field coordinate system is determined relatively to the substrate coordinate system in particular. In particular, a correction takes place by means of a relative displacement between the substrate and the mark field carrier, in particular by means of active movement of the substrate.

As, after fixing the substrate on the mark field carrier, a renewed movement of the substrate is not advantageous however, the correlation between the two coordinate systems is determined mathematically in particular. By means of the measurement of a plurality of position marks on the mark field carrier, in particular along two mutually perpendicular directions, the axial directions can be determined.

Analogous considerations apply for the axes of the substrate. A rotational matrix R can be calculated from these data. The displacement between the two coordinate origins is described by means of a vector v in particular. This means that the correction term for the correlation between the position marks on the mark field carrier and the structures on the substrate can be described by the equation $$x_{substrate} = R * x_{mark\,field} + v$$

The corresponding inverse representation is $$x_{mark\,field} = R^{-1} * x_{substrate} - v$$

The person skilled in the art knows the necessary matrix algebra.

As a plurality of position marks of the mark field or a plurality of structures on the substrate are measured for this process step, the process step cannot readily be assigned in a temporally unique manner. The correlation between the to coordinate systems can be carried out all the more accurately, the more data are present. Preferably, mathematical algorithms are used for determining the rotational matrix and the displacement vector, which are based on the least squares method. In the remainder of the text, it is assumed that the axial orientation of all coordinate systems involved always have the same origin and the same orientation.

The following convention is used for the description of the mathematical calculation process. The index i stands for ideal, the index r stands for real, the index S stands for structure and the index M stands for mark. A differential vector is always labelled with the lower-case letter r. The differential vector is calculated from a position vector in particular, which points towards the end point, less from the position vector, which points towards the starting point. Accordingly, the index of the end point is first noted, as is mathematical convention. The position vectors are not drawn in the figures described and shown below. The vector $r_{Sr,Si}$ to be calculated according to the invention is mentioned as an example. This is the differential vector, which describes the deviation of the position between the real structure and the ideal structure.

In a further process step, the positions of the ideal position marks of a mark field in the computer are compared with the positions of the real position marks of the mark field on the mark field carrier. By means of this measurement, one obtains a table, in which the real positions of the position marks and/or the ideal positions of the position marks and/or the differential vectors thereof are saved in the computer. The differential vectors are labelled as $r_{Mr,Mi}$. The thus-determined differential vectors result in a vector map, which is labelled in the remainder of the text as a mark field error vector map.

In a further process step, the positions of the real position marks of a mark field on the mark field carrier are compared with the positions of the structures on the substrate. Due to the measurement of the real positions of the position marks of the mark field and the positions of the structures on the substrate, one obtains a table, in which the real positions of the position marks and/or the positions of the structures on the substrate and/or the differential vectors are saved in the computer. The differential vectors are labelled as $r_{Sr,Mr}$. The thus-determined differences result in a vector map, which is labelled in the remainder of the text as a real mark structure differential vector map. That is the process step, which makes up a core idea of the invention, namely the association of the position marks of a mark field carrier with the structures of a substrate.

In a further process step, the positions of the ideal position marks of a mark field in the computer are compared with the ideal positions of the structure in the computer. By reading the ideal positions of the position marks of the mark field in the computer and the ideal positions of the structures in the computer, one obtains a table, in which the ideal positions of the position marks in the computer and/or the ideal positions of the structures in the computer and/or the differential vectors in the computer are saved. The differential vectors are labelled as rSi,Mi. The thus-determined differences result in a vector map, which is labelled in the remainder of the text as an ideal mark structure differential vector map. In particular, this process step only has to be carried out once for each combination of an ideal mark field and an ideal structure field.

$r_{Sr,Si} = r_{Mr,Mi} + r_{Sr,Mr} - r_{Si,Mi} - F$ is then given as a result, wherein F is the vector of the optical error calculated in the calibration process. Preferably, F is constant for all points, i.e. F does not represent a vector field, but rather a constant as a function of the location.

A multiple measurement is conceivable according to the invention, in order to increase the quality of the measurement by statistical means. The renewed measurement can be carried out fast by means of the data present and location of the location marks. The detection proceeds fastest if the detection takes place step for step from mark to mark. The use of a measurement system, which follows the absolute position of the substrate holder or the relative displacement of the substrate holder, continuously in particular, is therefore superfluous.

In a further optional, but particularly desired method step according to the invention, a rotation of the substrate, particularly by exactly 180°, takes place in order to measure all of the previously measured structures anew. Finding the structures can be carried out fast, as the structures in the preceding detection step have already been associated with the position-encoded location marks. By using algorithms, any optical error, which has occurred due to any oblique position of the optical axes of the optical systems, can be corrected.

All of the technically possible combinations and/or permutations and multiplications of the functional and/or material parts of the device and the associated changes in at least one of the method steps or methods are considered to be disclosed.

Insofar as device features are described in the present text and/or in the attached description of the figures, these should also be considered as disclosed as method features, and vice versa.

Further advantages, features and details of the invention result from the following description of preferred exemplary embodiments, as well as on the basis of the drawings.

BRIEF DESCRIPTION OF THE DRAWINGS

FIG. 6 shows a plan view and a sectional view according to the section line A-A of an embodiment of a substrate holder according to the invention in a fourth embodiment, FIG. 8 shows a lateral sectional view of an embodiment of the device according to the invention in a method step of detection according to the invention, FIG. 9 shows a partial side view of a detection step, FIG. 10 shows a partial side view of a detection step, FIG. 11 shows a partial side view of a detection step, FIG. 12 shows a partial side view of a detection step, FIG. 13 shows a partial side view of a detection step, FIG. 14a shows an overlay image created from a detection step at a first position in a first rotational location, FIG. 14b shows an overlay image created from a detection step at the first position in a second rotational location, FIG. 15a shows an overlay image created from a detection step at a second position in a first rotational location, FIG. 15b shows an overlay image created from a detection step at the second position in a second rotational location, FIG. 17 shows an illustration of the differential vectors arising.

In the figures, the same components or components with the same function are labelled with the same reference numbers.

DETAILED DESCRIPTION OF THE INVENTION

Figure 1A:
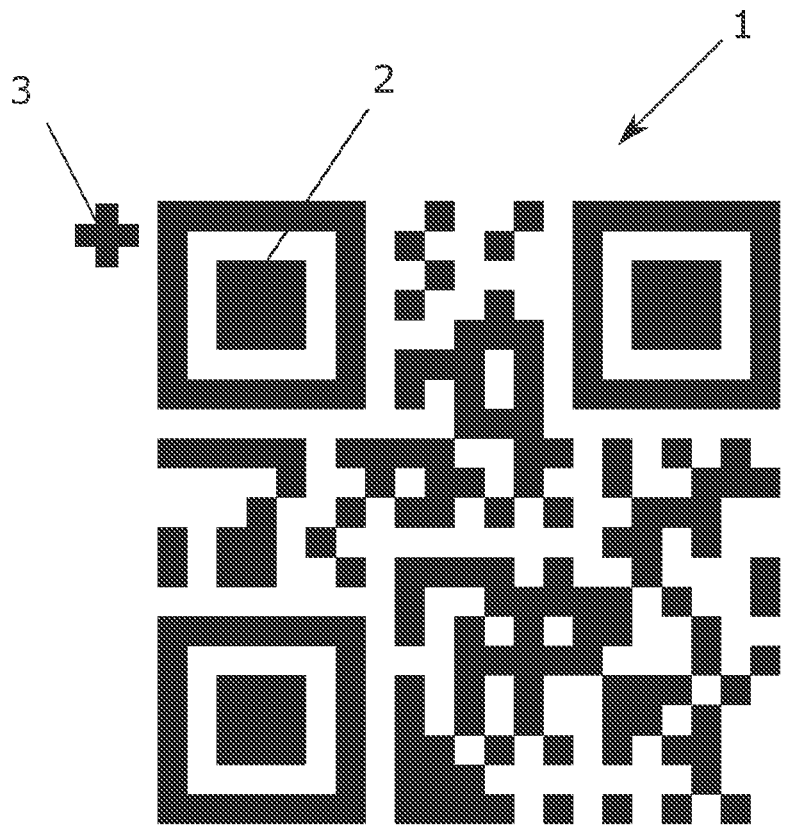
FIG. 1a shows a detail view of a first embodiment of a mark according to the invention having a location mark and a position mark.

The FIG. 1a shows a mark 1, comprised of a location mark 2, particularly a QR code and a position mark 3. In a particularly preferred embodiment according to the invention, the location mark 2 is also used as a position mark, so that the position mark 3 is omitted and would be contained in the location mark 2.

The location mark 2 is constructed in such a manner that an, in particular optical, system is able to read information. The exemplary QR code contains the readable position information (1, 11). This means that this location mark is located in the first row and the eleventh columns of a matrix of a mark field 4 shown in FIG. 2.

Figure 1B:
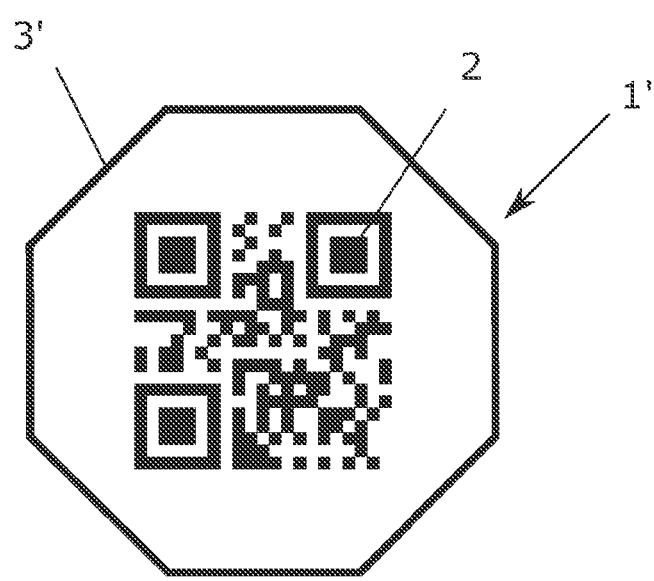
FIG. 1b shows a detail view of a second embodiment of a mark according to the invention having a location mark and a position mark.

The FIG. 1b shows a particularly preferred mark 1', comprised of a location mark 2, particularly a QR code and a position mark 3'. The location mark 2 is smaller in this specific embodiment than the position mark 3' and is enclosed by the position mark 3, particularly completely. An evaluation algorithm is able to detect the shape or contour of the position mark 3' and to determine an exact position of the position mark 3'. In the concrete case, the exact position would be the centre of the octagon. The centre of the octagon could for example be found by software in that an algorithm adapts a mathematical octagon to the contour of the octagon from the measured image and determines the centre from the mathematical octagon. Algorithms of this type are known to the person skilled in the art and should not be explained further here.

In the further descriptions of the figures, the mark 1 according to FIG. 1a is used by way of example for further showing the concept according to the invention.

Figure 2:
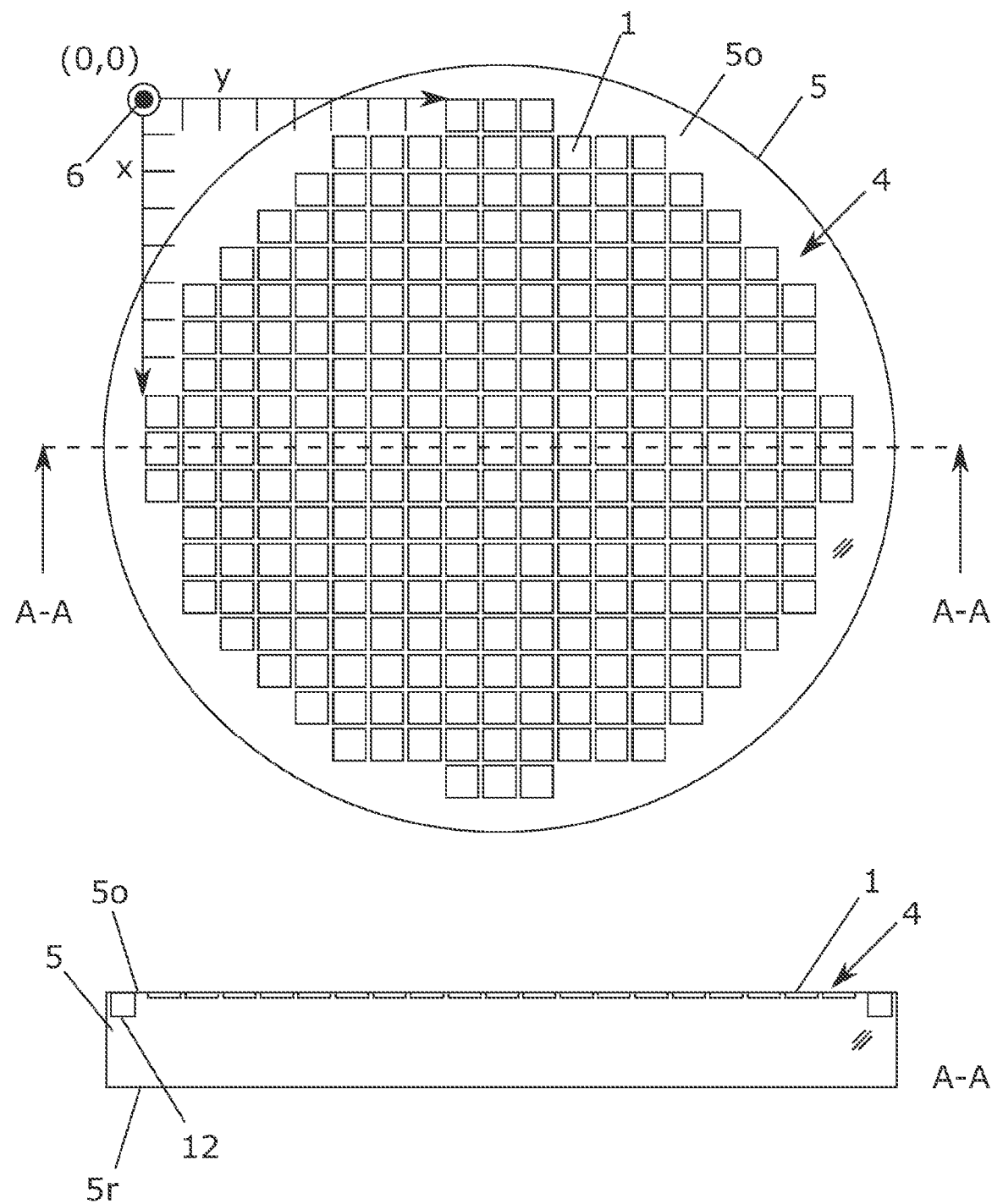
FIG. 2 shows a plan view and a sectional view according to the section line A-A of an embodiment of a mark field carrier according to the invention, having a mark field.

The FIG. 2 shows a plan view and a side view of a mark field carrier 5 having the mark field 4, comprised of a plurality of marks 1, which are placed highly symmetrically to one another in particular. The mark 1 according to FIG. 1a is located at the matrix position (1, 11), as it is located in the first row and the eleventh column in relation to the origin shown of a coordinate system 6 relating to the mark field carrier 5. Counting begins at zero here.

The mark field 4 is preferably located on a mark field carrier surface 5o of the mark field carrier 5. The mark field carrier 5 is preferably transparent, so that the mark field 4 can be detected from a mark field carrier rear side 5r through the mark field carrier 5. The mark field carrier 5 preferably has fixing means 12 in the form of vacuum tracks, with the aid of which a substrate 7 (cf. FIG. 8) can be fixed.

Figure 3:
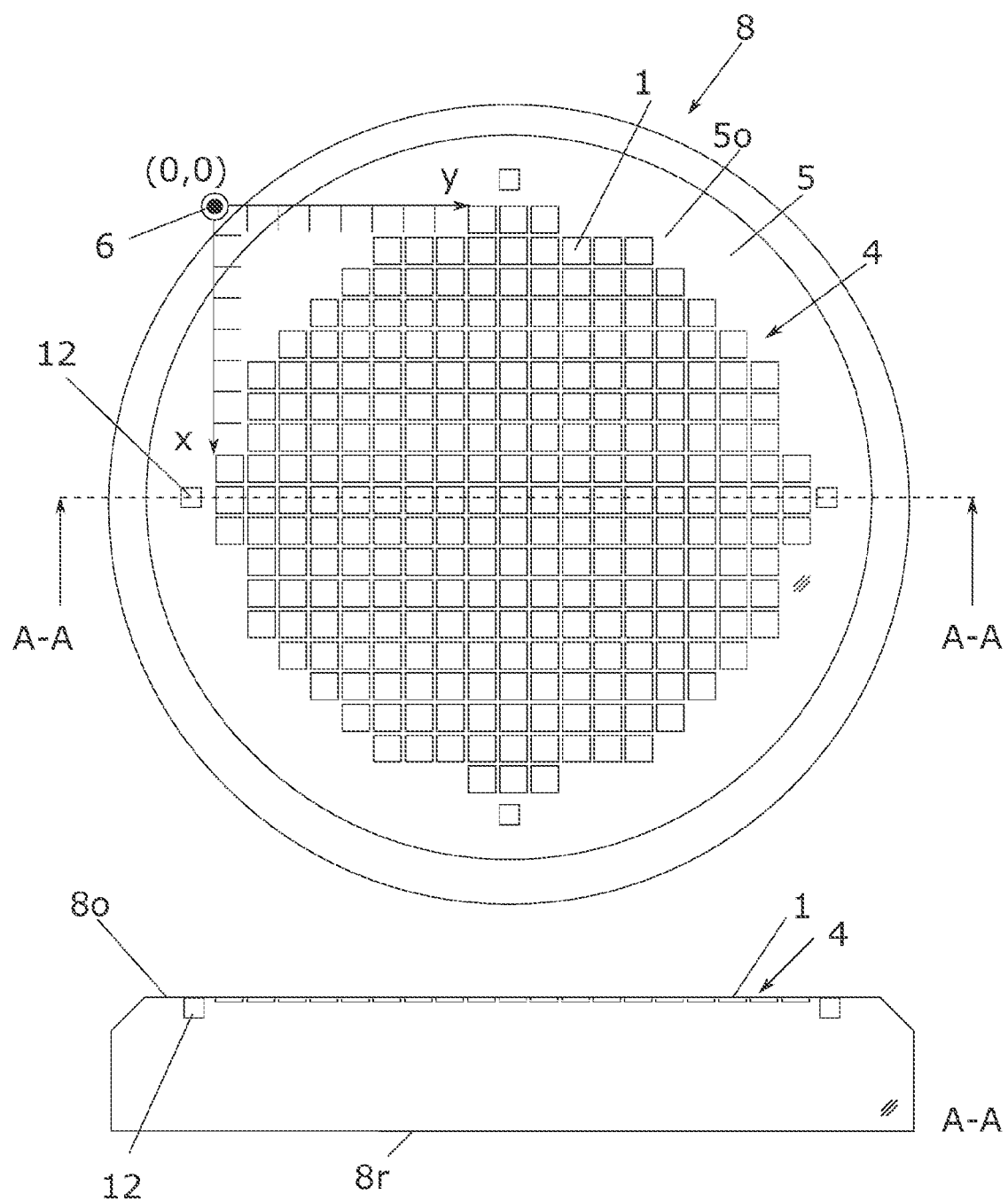
FIG. 3 shows a plan view and a sectional view according to the section line A-A of an embodiment of a substrate holder according to the invention in a first embodiment.

FIG. 3 shows a first embodiment of an, in particular transparent, substrate holder 8, which is constructed as a mark field carrier 5 at the same time. The mark field 4 is then preferably located on the same substrate surface 8o as the fixing means 12. In a more preferred embodiment according to the invention, the substrate holder 5 is non-transparent, wherein the mark field 4 is arranged on the substrate holder rear side 8r.

Figure 4:
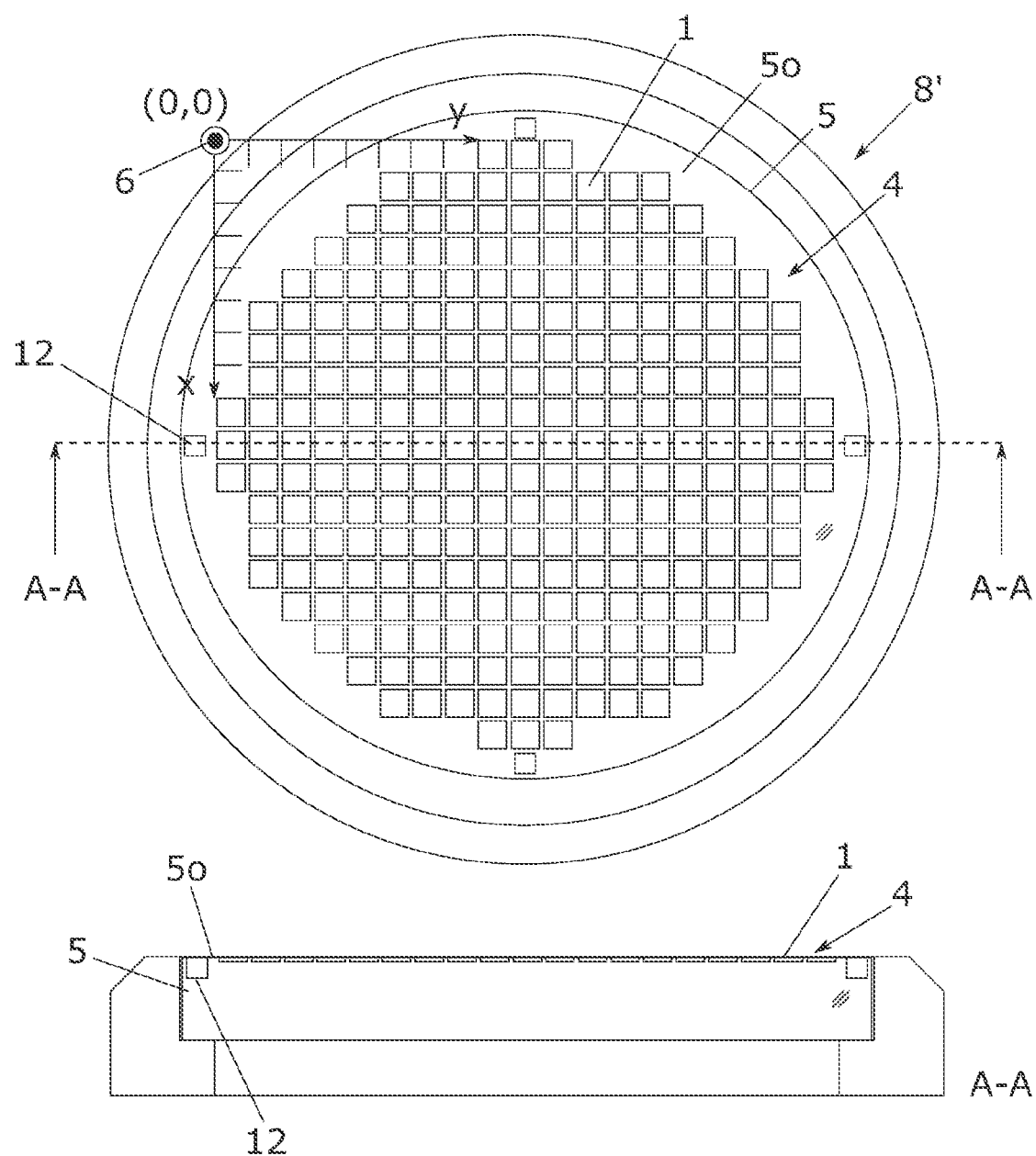
FIG. 4 shows a plan view and a sectional view according to the section line A-A of an embodiment of a substrate holder according to the invention in a second embodiment.

FIG. 4 shows a second embodiment of the substrate holder 8'. The substrate holder 8' accommodates the mark field carrier 5, that is to say, by contrast with the first embodiment, is not itself the mark field carrier. The mark field carrier 5 is preferably transparent. The mark field 4 is located on the same mark field carrier surface 5o as the fixing means 12. The mark field carrier 5 is not supported centrally and can therefore bend downwards, in particular owing to gravity, but also due to a force acting from above. Bending of this type would buckle the mark field 4 on the mark field carrier surface 5o and is therefore preferably to be reduced. This is achieved by means of a particularly thick design of the mark field carrier 5.

Figure 5:
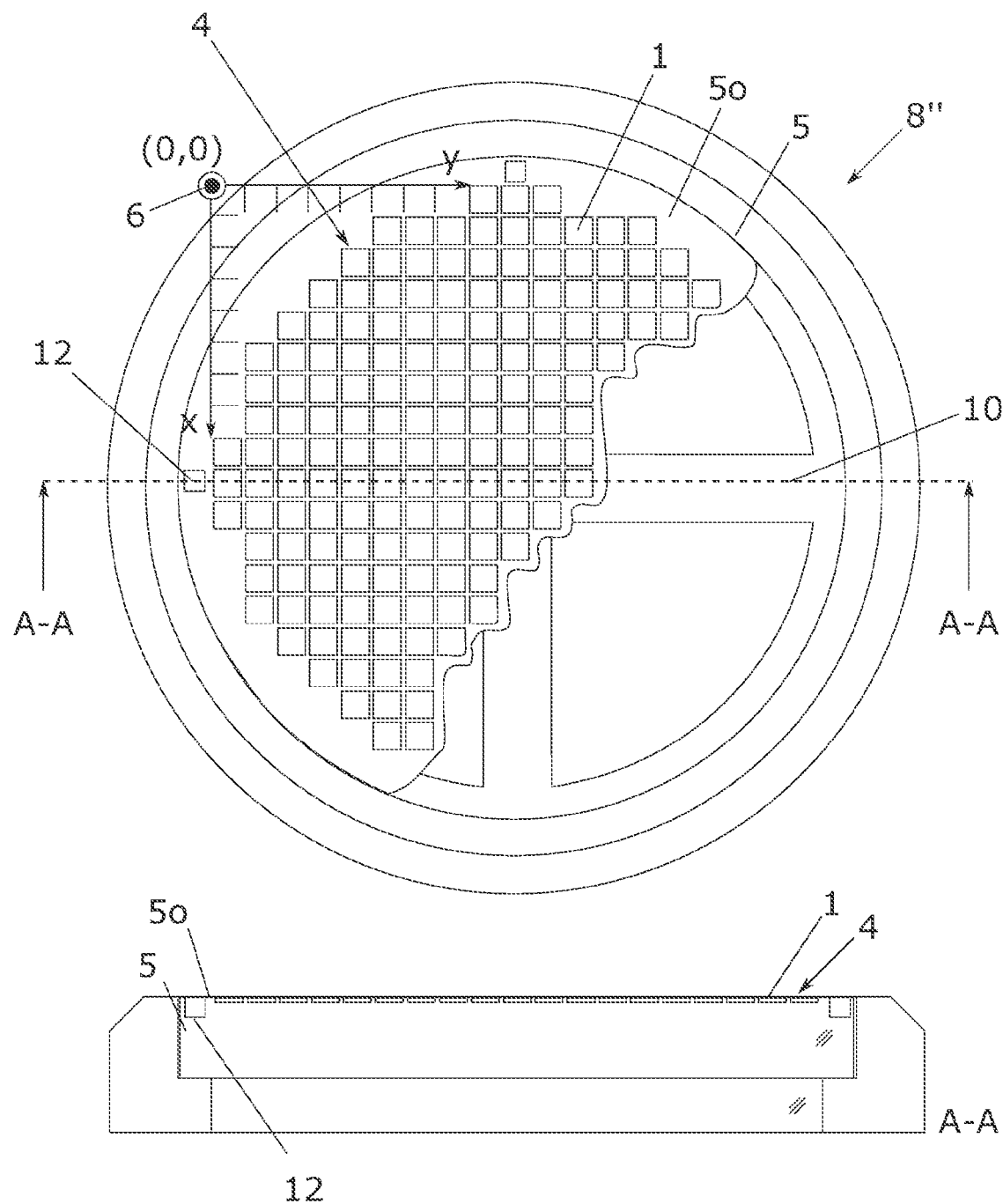
FIG. 5 shows a plan view and a sectional view according to the section line A-A of an embodiment of a substrate holder according to the invention in a third embodiment.

FIG. 5 shows a third further improved embodiment of the substrate holder 8". The substrate holder 8" has struts 10, which support the mark field carrier 5, so that bending is avoided to the greatest extent possible. The struts 10 are preferably inherently transparent.

FIG. 6 shows a fourth further improved embodiment of the substrate holder 8'''. The substrate holder 8''' has struts 10 having, in particular conically running, passages 14. Mark field carriers 5', which are constructed as inserts in particular, can be accommodated or are fixed in the passages 14, which mark field carriers have mark fields 4. In this specific embodiment, the fixing means 12 are for example located in the substrate holder 8'''.

In particular, the struts 10 exclusively have mark fields 4, so that no marks are provided in the free regions between the struts 10. The substrate holder 8''' is therefore constructed in a very filigrane and light manner and can be produced very easily. It has a high rigidity in spite of the lower thickness.

Furthermore, the mark field carriers 5' and thus the mark fields 4 can be replaced more easily.

Figure 7:
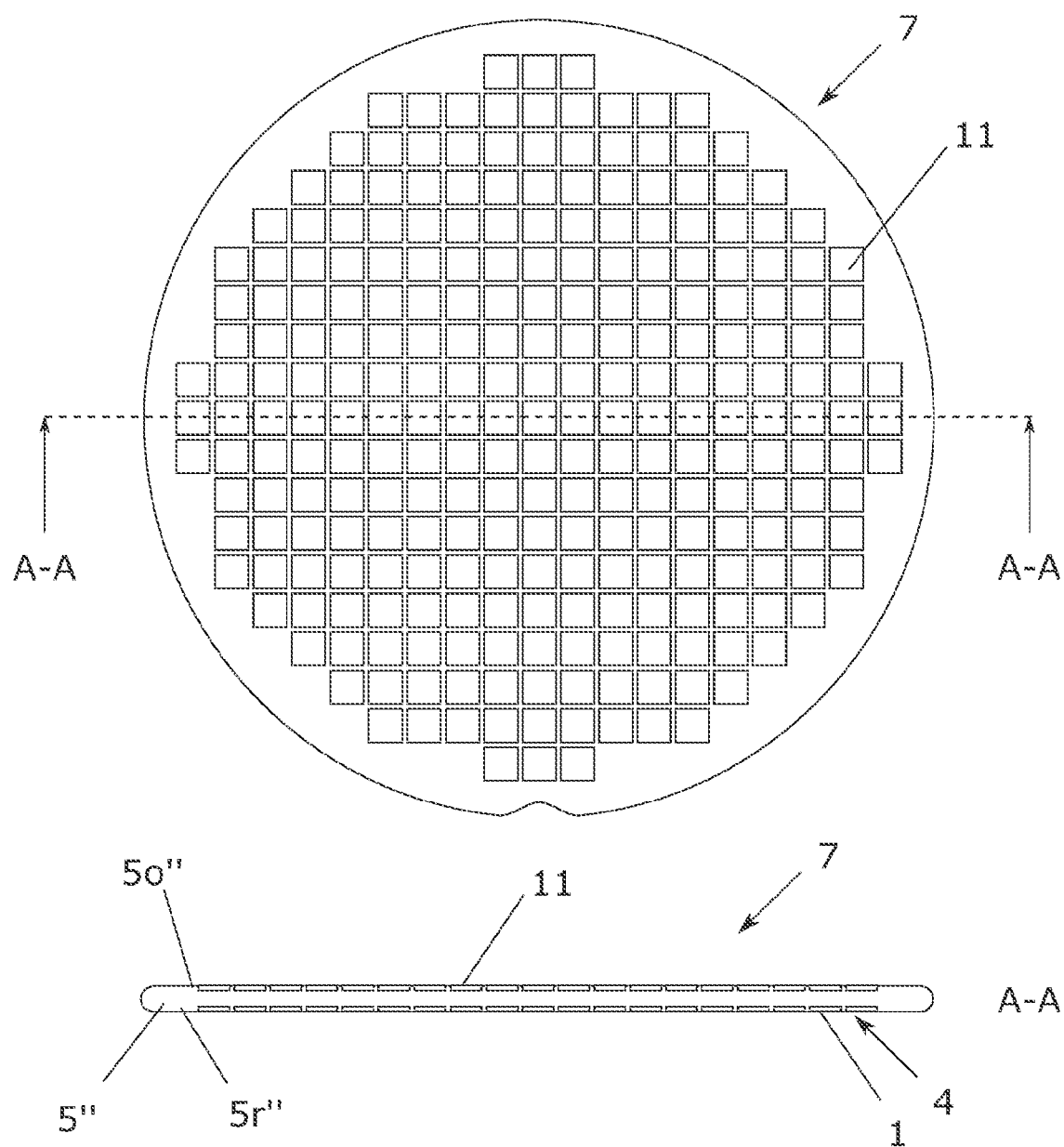
FIG. 7 shows a plan view and a sectional view of a substrate according to the invention, having structures and a mark field.

FIG. 7 shows a fifth, less preferred embodiment of the mark field carrier 5''', which is formed by the substrate 7 itself here. On one side, (mark field carrier rear side 5r''') the substrate 7 has structures 11 and the mark field 4 on the opposite side. This specific embodiment only makes sense if one can ensure that the mark field carrier rear side 5r''', on which the mark field 4 is located, is not deformed.

FIG. 8 shows the substrate holder 8' with the inserted and fixed transparent mark field carrier 5, on which the substrate 7 is fixed to structures 11 by means of the fixing means 12.

A first, in particular upper, optical system 13 detects, with a viewing area (illustrated enlarged), the substrate surface 7o, on which the structures 11 are arranged. The first optical system 13' is focussed onto the structures 11.

A second optical system 13', which is calibrated, preferably congruent, with the first optical system 13 in particular, detects the mark field carriers surface 5o with the mark field 4 through the transparent mark field carrier 5. The second optical system 13' is focussed onto the marks 2.

The detected images are, in particular digitally, overlaid and result in an overlay image, from which the spacings dx and dy of one (or more) structural feature 11c (here: upper left corner of the structure 11) from the highly accurate position mark 3 with respect to an X-Y coordinate system are determined.

In the example shown in FIG. 8, the corners of the structure 11 (structural features 11c) are not congruent with the position mark 3, thus the spacings dx and dy are not equal to zero. Furthermore, the structure 11 is slightly rotated in relation to the reference alignment of the position mark 3.

The location mark 2, which allows information about the rough position, can additionally be detected in the viewing area of the optical systems 13, 13' or the overlay image.

It is possible to determine the rotational state and/or a deformation of the structure 11 from a detection of a plurality of structural features 11c.

The FIGS. 9 to 13 show further detection steps in different example cases which differ as follows:

FIG. 9: The optical axes of the two optical systems 13 are congruent to one another. Furthermore, the characteristic structural features 11c of the structures 11 are located directly above the position markers 3 relevant for the position measurement. An ideal overlay image results accordingly. A further feature includes the densities of the structures 11 on the substrate surface 7o being identical to the density of the position marks 3 on the mark field carrier surface 5o. A mark field carrier 5 is preferably constructed, which can be used for different substrates 7 with different densities on structures 11.

According to the invention, the density of the marks 1 is in particular higher than the density of the structures 11. Thus, it is ensured that in the region of astructure 11 and/or a structural feature 11c, at least one mark 1 lies in the viewing area of the optical systems 13, 13'.

FIG. 10: The optical axes of the two optical systems 13 are congruent to one another. Furthermore, the characteristic features 11c of the structures 11 are located directly above the position markers 3 relevant for the position measurement. The resultant difference in the overlay image can be traced back exclusively to the displacement between the position marks 3 and the structures 11 and is not based on an optical error. A further feature includes the densities of the structures 11 on the substrate surface 7o not being identical to the density of the position marks 3 on the mark field carrier surface 5o.

It can be seen from the present figure that although there is a translational displacement between the structures 11, more precisely the characteristic features 11c of the structures 11 and the position marks 3, these are uniform for all of the overlay images (shown). That is synonymous with the statement that one would only have to displace the substrate 7 relatively to the mark field carrier 5 in order to obtain the congruence state of FIG. 9 (naturally only for every second structure 11, as the density of the structures in FIG. 10 is only half as large as the density in FIG. 9).

FIG. 11: The optical axes of the two optical systems 13, 13' are not congruent and not even parallel to one another. Therefore, it cannot be assumed that the characteristic structural features 11c of a structure 11 are congruent with the respective position mark 3 (even if they lie exactly above one another) in the overlay image. The oblique position of the optical axes, just like changes in the thickness of the substrate 7, a wedge error of the substrate 7, etc. lead to the overlay images not being ideal, even under ideal conditions. In order to correct this type of optical errors, (as described above) a rotation by 180° is carried out, a second measurement of all structures is undertaken and the optical error, which is primarily to be traced back to the oblique position of the optical axes, is calculated from the average value of the thus-obtained positions of the characteristic structural features 11c of the structures 11.

FIG. 12: The density of the structures 11 is different from the density of the position marks 3. The characteristic structural features 11c are not congruent to the position marks 3 and the optical axes of the optical systems 13 are neither congruent nor parallel to one another. Due to the elimination of the error, which emerges from the optical axes, according to the description from FIG. 11, an overlay image according to FIG. 10 still remains then.

FIG. 13: This embodiment shows the preferred case according to the invention. In turn, the densities of the structures 11 and the position marks 3 are different. Due to the oblique optical axes, an optical error results in the overlay image, which is calculated by rotation through 180° and a second complete measurement of all structures. Furthermore, the structure 11 is located much too far to the left. It is conceivable that the surface had been distorted by a process and/or that this part has thermally expanded owing to thermal loading. The displacement of the structure 11 therefore no longer has anything to do with the global displacement of all structures 11 in relation to the mark field 4, which can in particular be traced back to the fact that the substrate 7 has experienced a displacement as a whole in relation to the mark field 4. This displacement of the structure 11 is location-specific and immanent. It is of primary importance that the mark field 4 lying therebelow is and remains highly symmetrical.

The following figures are used for further explaining possible sources of errors and the respective measures of the method according to the invention in order to be able to determine and evaluate the sources of errors during the determination.

FIG. 14a shows an overlay image of a structure 11 having a position mark 3 and a location mark 2 at a position (11,1) in a rotational location of 0°. The spacings dx(11,1), 0° and dy(11,1), 0° between the position mark 3 and the characteristic structural feature 11c of the structure 11.

FIG. 14b shows an overlay image of a structure 11 having a position mark 3 and a location mark 2 at a first position (11,1) in a rotational location of 180°. The spacings dx(11,1), 180° and dy(11,1), 180° between the position mark 3 and the characteristic structural feature 11c of the structure 11.

The errors, which result due to the oblique position of the optical axes and other sources of error, can be calculated in the x or y direction from the values dx(11,1),0° and dx(11,1),180° or dy(11,1),0° and dy(11,1),180°, so that the pure offset between the position mark 3 and the characteristic feature 11c of the structure 11 can be determined (calculated).

FIGS. 15a and 15b show a different structure 11 at a second position (12,1), in turn at the two different rotational locations of 0° and 180°. Here also, the errors, which result due to the oblique position of the optical axes and other sources of error, can be calculated in the x or y direction. FIGS. 14 and 15 should show that the horizontal and/or vertical difference between the position marks 3 and the characteristic structural features 11c can deviate very strongly at different positions. These deviations are primarily the result of distortions, expansion, etc.

Figure 16:
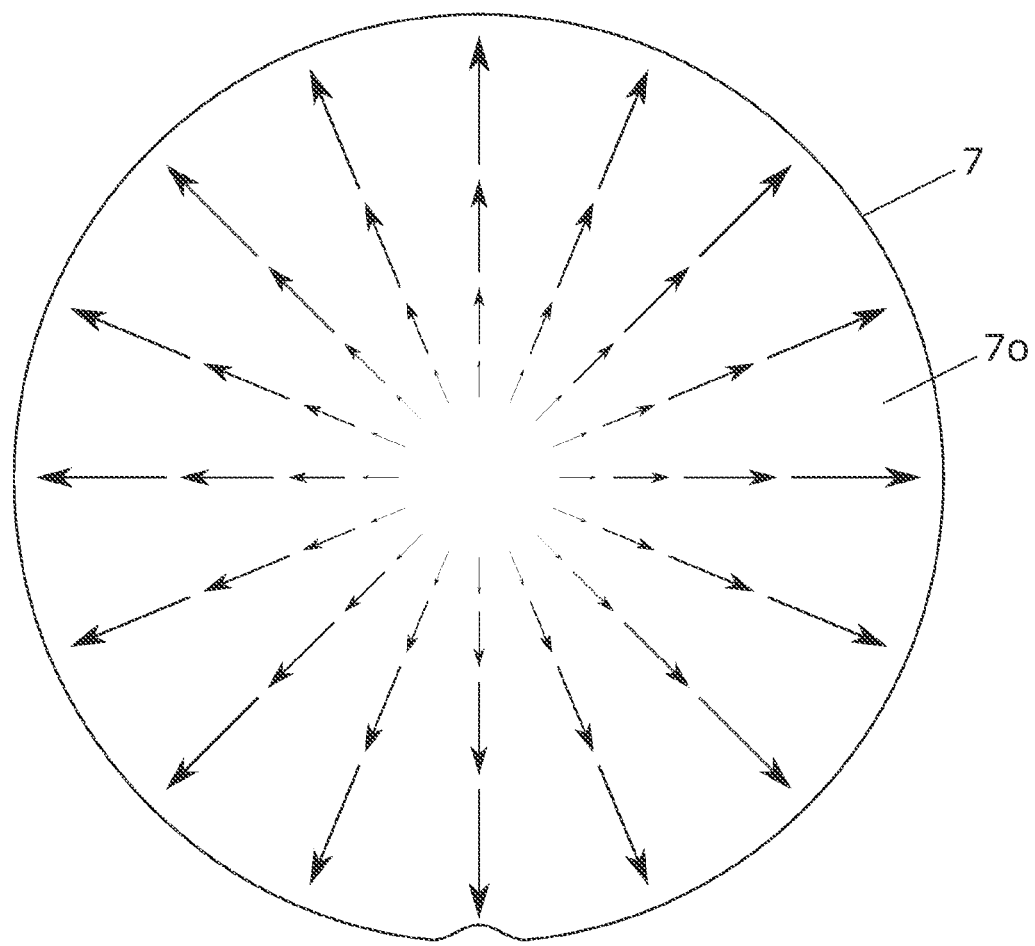
FIG. 16 shows a vector field created according to the invention for illustrating deviations determined according to the invention.

FIG. 16 shows a vector field. The vector field schematically describes how the structures 11(not drawn in here) are deformed as a function of the location. The size of the arrows increases from the centre outwards. Thus, it is indicated that the structures are stretched towards the edge of the substrate 7. The length of the arrows increases. Thus, it is indicated that the translational displacement increases towards the edge. Here, one is concerned with a classic run-out error. As none of the arrows has a tangential component, no rotational deviation has been determined. In practice, the vector fields determined according to the invention look more complicated.

FIG. 17 shows a schematic illustration of a section of the image overlay of ideal and real structures and position marks in a location. The illustration is used for mathematically showing the relationship of the different values which can be calculated and measured. For the sake of simplicity, the exact illustration of the location marks is dispensed with. The coordinate axes of the coordinate systems of the ideal and real planes had already been adapted to one another, so that all coordinate systems have the same orientation and the same origin as one another. With the exception of the optical error, which has not explicitly been drawn in, but rather is only mentioned in the formula, all other differential vector relationships can be seen. The position of the ideal position mark 3i and the position of the ideal structure 11i are present in the computer. The position of the real position mark 3r and the position of the real structure 11r are measured. According to the invention, the differential vector $r_{Sr,Mr}$ can be measured. The differential vector $r_{Si,Mi}$ can be determined from the computer data directly. No measurement is required here. The differential vector $r_{Mr,Mi}$ can likewise be measured. The differential vector $r_{Sr,Si}$, that is to say the deviation of the position of the real structure 11r from the position of the ideal structure 11i, can be calculated from the data obtained.

REFERENCE LIST 1, 1' Mark
2 Location mark
3, 3', 3i, 3r Position mark
4 Mark field
5, 5', 5'' Mark field carrier
5o, 5o', 5o'' Mark field carrier surface
5r, 5r'' Mark field carrier rear side
6 Body-fixed coordinate system 7 Substrate
7o Substrate surface
8, 8', 8", 8'" Substrate holder
8o Substrate holder surface
8r Substrate holder rear side
9 Fixing elements
10 Struts
11, 11i, 11r Structures
11c Characteristic structural feature
12 Fixing means
13, 13' Optical systems
14 Passages

What is claimed is:

1. A mark field for use in determining X-Y positions of structural features of structures arranged on a substrate, said mark field comprising:
a plurality of marks located on a substrate holder on which the substrate is fixed, the plurality of marks being located over or underneath the structures, each of said marks comprising:
one or more location marks containing readable position information enabling a determination of respective locations of the location marks in the mark field, and
one or more position marks assigned to one of the location marks, each of the position marks being set in relation to the X-Y positions of the structural features of the structures.

2. The mark field according to claim 1, wherein the location marks and/or position marks are arranged in a matrix with uniform spacings between the location marks and/or the position marks.

3. The mark field according to claim 2, wherein the matrix is a symmetrical matrix.

4. The mark field according to claim 1, wherein adjacent location marks and/or adjacent position marks are arranged equidistantly on the mark field.

5. The mark field according to claim 1, wherein the mark field has at least 10×10 marks.

6. The mark field according to claim 1, wherein spacings between adjacent location marks are smaller than the width and/or height or the diameter of the location marks.

7. The mark field according to claim 6, wherein a ratio between the spacing and the width and/or height or the diameter of the location marks smaller than 1.

8. The mark field according to claim 1, wherein each mark of the mark field is different.

9. The mark field according to claim 8, wherein each mark of the mark field has a different encoding.

10. The mark field according to claim 9, wherein said encoding is a position encoding.

11. The mark field according to claim 1, wherein the location marks have one or more of the following characteristics:
QR code,
barcode,
geometric,
character sequence, and
image.

12. The mark field according to claim 11, wherein said geometric is a three-dimensional figure.

13. The mark field according to claim 11, wherein the character sequence is a letter sequence and/or a number sequence.

14. The mark field according to claim 13, wherein the number sequence is a binary code.

15. The mark field according to claim 1, wherein the at least two location marks and the at least one position mark are optically measurable and simultaneously optically detectable within a predefined viewing area of an optical system.

16. A device for determining X-Y positions of structural features of structures arranged on a substrate, wherein the X-Y positions can be determined relatively to a mark field fixed with respect to the substrate, said mark field comprising:
a plurality of marks located on a substrate holder on which the substrate is fixed, the plurality of marks being located over or underneath the structures, each of said marks comprising:
one or more location marks containing readable position information enabling a determination of respective locations of the location marks in the mark field, and
one or more position marks assigned to one of the location marks, each of the position marks being set in relation to the X-Y positions of the structural features of the structures.

17. A method for determining X-Y positions of structural features of structures arranged on a substrate, the method comprising:
determining, via a computer, the X-Y positions relatively to a mark field fixed with respect to the substrate, said mark field including a plurality of marks located on a substrate holder on which the substrate is fixed, the plurality of marks being located over or underneath the structures, each of said marks including one or more location marks and one or more position marks assigned to one of the location marks the location marks containing readable position information enabling a determination of respective locations of the location marks in the mark field, each of the position marks being set in relation to the X-Y positions of the structural features of the structures.

* * * * *